(12) United States Patent
Lee et al.

(10) Patent No.: US 11,370,864 B2
(45) Date of Patent: Jun. 28, 2022

(54) POLYFLUORENE-BASED POLYMER-POLYVINYLIDENE FLUORIDE GRAFT COPOLYMER AND ELEMENT INCLUDING THE SAME

(71) Applicant: Industry-Academic Cooperation Foundation, Yonsei University, Seoul (KR)

(72) Inventors: Jinkyun Lee, Incheon (KR); Sejin Lee, Incheon (KR); Jiyeon Kim, Hanam-si (KR); Cheolmin Park, Seoul (KR); Euihyuk Kim, Seoul (KR); Joona Bang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 31 days.

(21) Appl. No.: 17/106,427

(22) Filed: Nov. 30, 2020

(65) Prior Publication Data
US 2022/0025095 A1 Jan. 27, 2022

(30) Foreign Application Priority Data
Jul. 27, 2020 (KR) .................. 10-2020-0093281

(51) Int. Cl.
| | | |
|---|---|---|
| *C08F 259/08* | (2006.01) | |
| *C08F 2/38* | (2006.01) | |
| *C08J 5/18* | (2006.01) | |
| *H01L 33/26* | (2010.01) | |
| *H01L 41/18* | (2006.01) | |

(52) U.S. Cl.
CPC .............. *C08F 259/08* (2013.01); *C08F 2/38* (2013.01); *C08J 5/18* (2013.01); *C08F 2438/03* (2013.01); *H01L 33/26* (2013.01); *H01L 41/18* (2013.01)

(58) Field of Classification Search
CPC .... C08F 2438/03; C08F 259/08; C08F 14/22; C08F 114/22; C08F 214/22
See application file for complete search history.

(56) References Cited

U.S. PATENT DOCUMENTS

| | | | | |
|---|---|---|---|---|
| 2004/0079924 A1* | 4/2004 | Kwag | .................. | H01L 51/004 252/301.35 |
| 2019/0023834 A1* | 1/2019 | McCairn | .............. | C09D 183/04 |

FOREIGN PATENT DOCUMENTS

| | | | | | |
|---|---|---|---|---|---|
| KR | 20080043160 | A | * | 5/2008 | |
| WO | WO-2005100437 | A1 | * | 10/2005 | ............. C08G 61/02 |

* cited by examiner

*Primary Examiner* — Mark S Kaucher
(74) *Attorney, Agent, or Firm* — Paratus Law Group, PLLC

(57) ABSTRACT

Disclosed is a graft copolymer containing a polyfluorene-based polymer as a main chain and a polyvinylidene fluoride (PVDF) as a side chain, and an element including the same. The graft copolymer contains both the polyfluorene-based polymer and the PVDF, so that the graft copolymer may increase miscibility between polymers to prepare a composite having excellent performance, prepare an uniform thin film through a solution process, and be used as a single material that exhibits both piezoelectric properties and luminescence properties.

16 Claims, 31 Drawing Sheets

Macro CTA (red)

PVDF graft copolymer (red)

POLYFLUORENE-BASED POLYMER-POLYVINYLIDENE FLUORIDE GRAFT COPOLYMER AND ELEMENT INCLUDING THE SAME

CROSS-REFERENCE TO PRIOR APPLICATION

This application claims priority to Korean Patent Application No. 10-2020-0093281 (filed on Jul. 27, 2020), which is hereby incorporated by reference in its entirety.

BACKGROUND

The present disclosure is directed to a polyfluorene-based polymer-poly vinylidene fluoride (PVDF) graft copolymer, and an element including the same.

More specifically, in the present disclosure, a polyfluorene-based polymer containing a hydroxyl group and emitting light of three colors of red, green and blue was synthesized; a macro chain transfer agent (Macro CTA) was synthesized by introducing a xanthate group into the polyfluorene-based polymer through Steglich esterification; and a graft copolymer containing the polyfluorene-based polymer emitting light as a main chain and a PVDF capable of exhibiting piezoelectric properties as a side chain was synthesized by using a reversible addition-fragmentation chain transfer polymerization (RAFT) method. The prepared copolymer may increase the miscibility between two different polymers. Further, it is expected that the prepared copolymer will be able to exhibit both luminescence properties and piezoelectric properties with a single material.

A synchronized piezoelectric-luminescence element (SPL element) refers to an element that operates by an external stimulus such as sound, pressure, and vibration, unlike a conventional element that operates (emits light, sounds, etc.) by injection of electrical energy. If the element may operate by the external stimulus, the element may be driven with low power and an overall weight of the element will be reduced, compared to existing electrical equipment. For example, a wearable device developed till now has been used only as a restrictive function due to low power efficiency and heavy weight, and has played an auxiliary role of hardware such as a smartphone. However, if the SPL element is used, an ultra-low power element may be implemented and a weight may be light. A composite of a material exhibiting piezoelectric properties and a material exhibiting luminescence properties has been mainly used as a material for such an SPL element.

In general, a high fluorine-based polymer such as the PVDF has been used as an organic material exhibiting piezoelectric properties. The PVDF has been widely used because it may easily form a crystal structure of a β-phase with a polarity to cause a potential difference even by a minute stimulus such as vibration and pressure, thereby exhibiting piezoelectric properties. In addition, the PVDF has more excellent thermal and mechanical properties than an inorganic material having a perovskite structure used as an existing piezoelectric material, does not have chemical invasion to a general organic electronic material, and may therefore be used as an important material for manufacturing a flexible and foldable electric device. The PVDF may be prepared by radical polymerization, and may be synthesized by a free radical polymerization, reversible addition-fragmentation chain-transfer polymerization (RAFT polymerization) or iodine transfer polymerization (ITP polymerization) method.

Examples of a light emitting material may include inorganic and organic materials. Typical examples of the inorganic light emitting material include a composite of zinc and selenium, which has an advantage that mechanical strength, thermal stability, and color purity are excellent, but has a disadvantage that a high driving voltage is required and a weight is heavy. Examples of the organic polymer light emitting materials include a polyfluorene-based polymer, which has an advantage that ductility is more excellent than that of an existing inorganic light emitting material and various types of devices may be manufactured because the polyfluorene-based polymer may be used to manufacture an element through a solution process. Also, a band-gap may be adjusted by changing a monomer used for synthesis of a polymer and serving as a donor-acceptor, and as the band-gap is adjusted, a wavelength of light emitted by the element may be changed, and all of three colors of red, green and blue may thus be implemented. Polyfluorene-based polymers are generally polymerized by palladium catalyzed Suzuki coupling.

A composite of a high fluorine-based polymer and an inorganic material such as ZnS has been mainly used as a material for the SPL element studied till now, but the composite has a form in which the polymer and the inorganic material are mixed with each other by physical bonding, and thus, has a limitation that it exhibits low performance in terms of miscibility, mechanical properties, and stability.

Thus, in order to develop a piezoelectric-luminescence material that exhibits excellent performance, a single material that increases miscibility through chemical bonding rather than simple physical mixing or implements luminescence-piezoelectric properties should be developed.

SUMMARY

To solve the above problem, an object of the present disclosure is to provide a polyfluorene-based polymer-polyvinylidene fluoride graft copolymer, which is a single SPL material having both piezoelectric properties and luminescence properties, and an element including the same.

In general, miscibility between a PVDF, which is a high fluorine-based polymer having excellent piezoelectric properties, and a polyfluorene-based polymer having excellent luminescence properties, is very poor, and solubility properties between them are very different, such that it is difficult to form a composite of the PVDF and the polyfluorene-based polymer. In addition, the PVDF and the polyfluorene-based polymer may not exhibit excellent performance because it is difficult to form a thin film having a uniform form even in the manufacture of the element. Accordingly, in the present disclosure a technology for combining advantages of these two materials with each other has been developed. That is, a material capable of increasing miscibility between the PVDF and the polyfluorene-based polymer is synthesized by synthesizing a copolymer of the PVDF and the polyfluorene-based polymer, and furthermore, a single material that implements piezoelectric-luminescence properties is manufactured. Synthesis and operation processes will be briefly described. (1) A polyfluorene-based polymer containing a hydroxy group is synthesized through Suzuki coupling. (2) A xhanthate group is introduced so that the polyfluorene-based polymer may be used as a macro chain transfer agent (Macro CTA). (3) A PVDF-polyfluorene-based copolymer is synthesized by a RAFT polymerization method using the Macro CTA synthesized in (2). It is possible to manufacture an SPL element having excellent performance using the synthesized copolymer, and the composite of the PVDF-based polymer and the polyfluorene-based polymer, and furthermore, it is possible to manufacture an SPL element with a single material to implement both piezoelectric properties and luminescence properties.

To achieve the above object, the present disclosure provides a polyfluorene-based polymer-polyvinylidene fluoride graft copolymer represented by the following Formula 1:

$R_6$ and $R_7$ are each independently a hydrogen atom, a deuterium atom, a halogen atom, a cyano group, a substituted or unsubstituted alkyl group having 1 to 10 carbon atoms, a substituted or unsubstituted alkyl xanthate group having 1 to 10 carbon atoms, or a substituted or unsubstituted aryl group having 6 to 30 ring carbon atoms, a, b, c, and d are each independently an integer of 1 to 3, and n is an integer of 1 to 5.

[Formula 1]

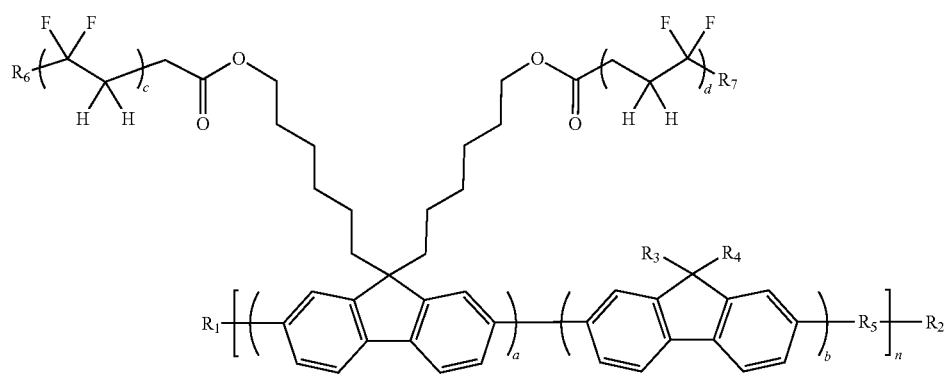

wherein $R_1$ and $R_2$ are each independently a hydrogen atom, a deuterium atom, a halogen atom, a cyano group, a substituted or unsubstituted aryl group having 6 to 30 ring carbon atoms, or a substituted or unsubstituted heteroaryl group having 2 to 30 ring carbon atoms, $R_3$ and $R_4$ are each independently a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, $R_5$ is a direct linkage, a substituted or unsubstituted arylene group having 6 to 30 ring carbon atoms, or a substituted or unsubstituted heteroarylene group having 2 to 30 ring carbon atoms, Herein, $R_5$ may be a direct linkage, or a substituted or unsubstituted benzothiadiazolylene group.

Also, $R_6$ and $R_7$ may each independently be an alkyl xanthate group having 1 to 10 carbon atoms substituted by a fluorine atom.

Further, Formula 1 may be represented by any one of the following Formulas 1-1 to 1-3:

[Formula 1-1]

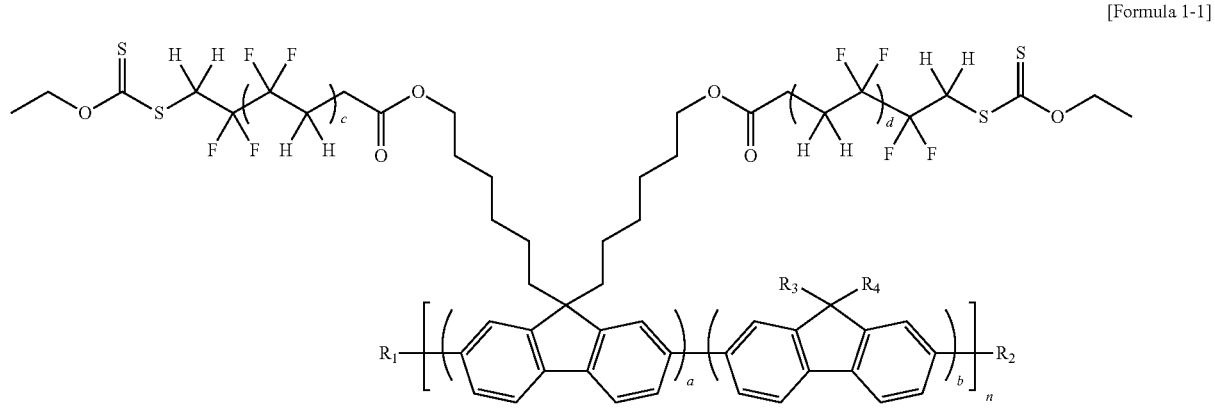

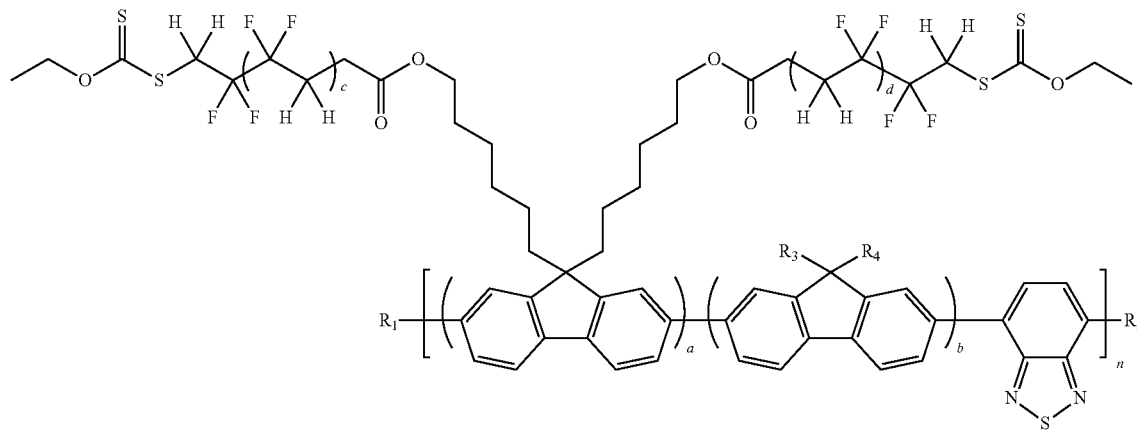
[Formula 1-2]
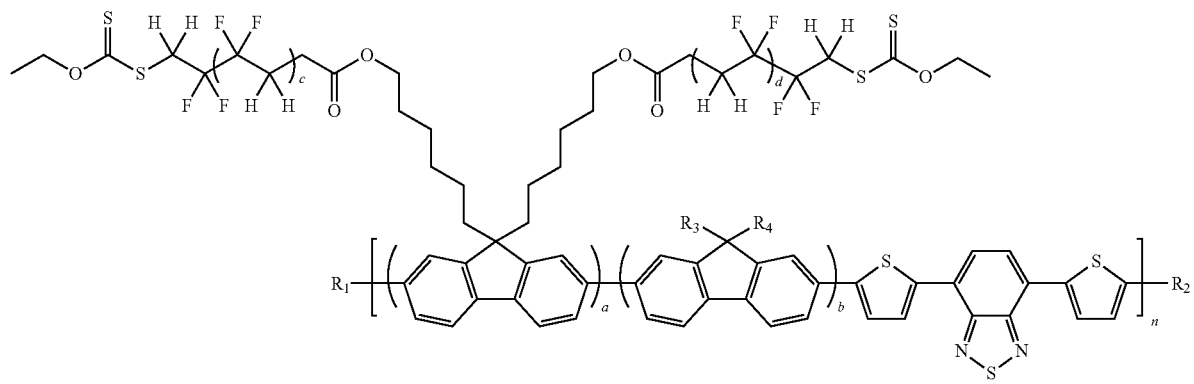
[Formula 1-3]
wherein $R_1$ to $R_4$, a to d, and n are as defined in Formula 1.
Herein, $R_1$ and $R_2$ may each independently be a substituted or unsubstituted phenyl group, and $R_3$ and $R_4$ may each independently be a substituted or unsubstituted octyl group.
In addition, Formula 1 may be represented by any one of the following Formulas 1-4 to 1-6:
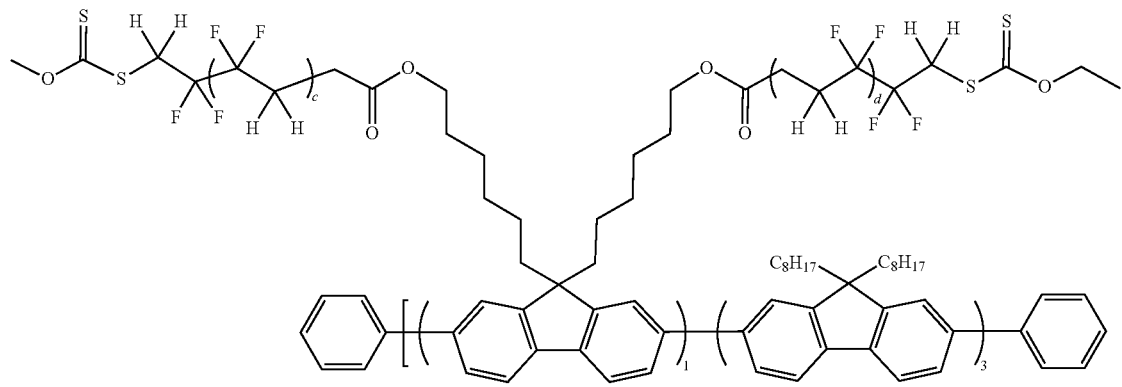
[Formula 1-4]

[Formula 1-5]

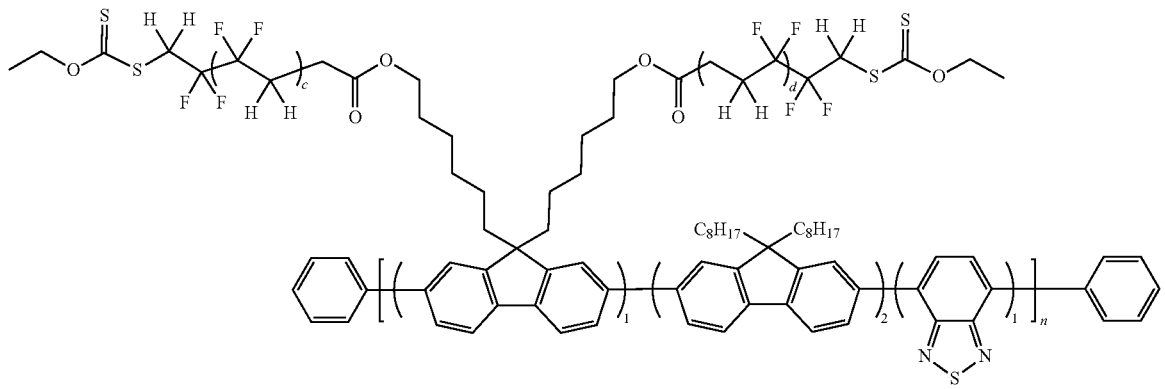

[Formula 1-6]

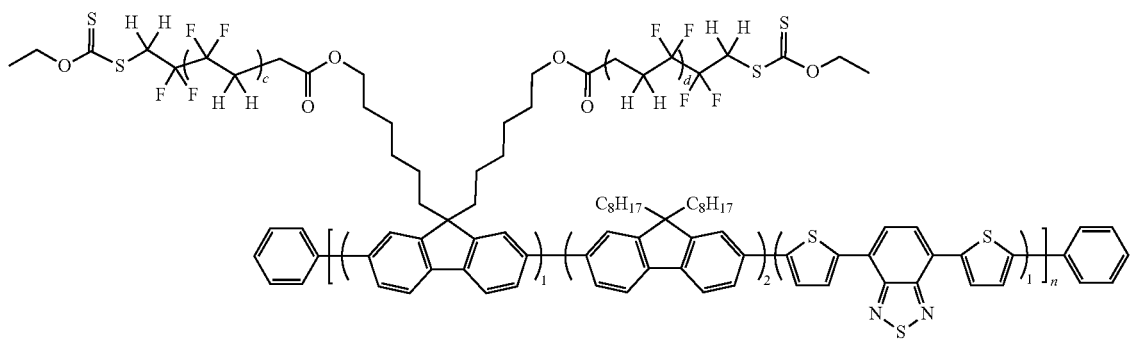

wherein c, d, and n are as defined in Formula 1.

Herein, a copolymer represented by Formula 1-4 may emit blue light, a copolymer represented by Formula 1-5 may emit green light, and a copolymer represented by Formula 1-6 may emit red light.

In addition, the present disclosure provides an element comprising: a substrate; a first electrode disposed on the substrate; a light emitting layer disposed on the first electrode; and a second electrode disposed on the light emitting layer, wherein the light emitting layer includes a polyfluorene-based polymer-polyvinylidene fluoride graft copolymer represented by Formula 1.

Advantageous Effects

In the present disclosure, a polyfluorene-based polymer containing a hydroxy group was synthesized, and a xanthate group was introduced into the polyfluorene-based polymer to synthesize a Macro CTA. A RAFT polymerization method using the xanthate group of the Macro CTA allowed a PVDF to grow in a side chain. Finally, a graft copolymer (polyfluorene-based polymer-g-PVDF) was synthesized, which contains a polyfluorene-based polymer exhibiting luminescence properties as a main chain and a PVDF exhibiting piezoelectric properties as a side chain.

Because the synthesized graft copolymer may increase the miscibility between the polyfluorene-based polymer and the PVDF, the synthesized graft copolymer may prepare a composite having excellent performance and was expected to help to form a thin film having excellent uniformity. In addition, the synthesized graft copolymer contains both a polymer having piezoelectric properties and a polymer having luminescence properties together, and thus may be used as a single piezoelectric-luminescence material.

Accordingly, the element including the material may visualize input signals to perform efficient communication, and thus may be usefully used in the field of future-oriented synesthesia technology. In addition, the element including the material is an all-in-one element, so the element is economically competitive because no additional parts and processes are required, which will greatly contribute to the commercialization of a synesthesia element.

DETAILED DESCRIPTION

Figure 1:
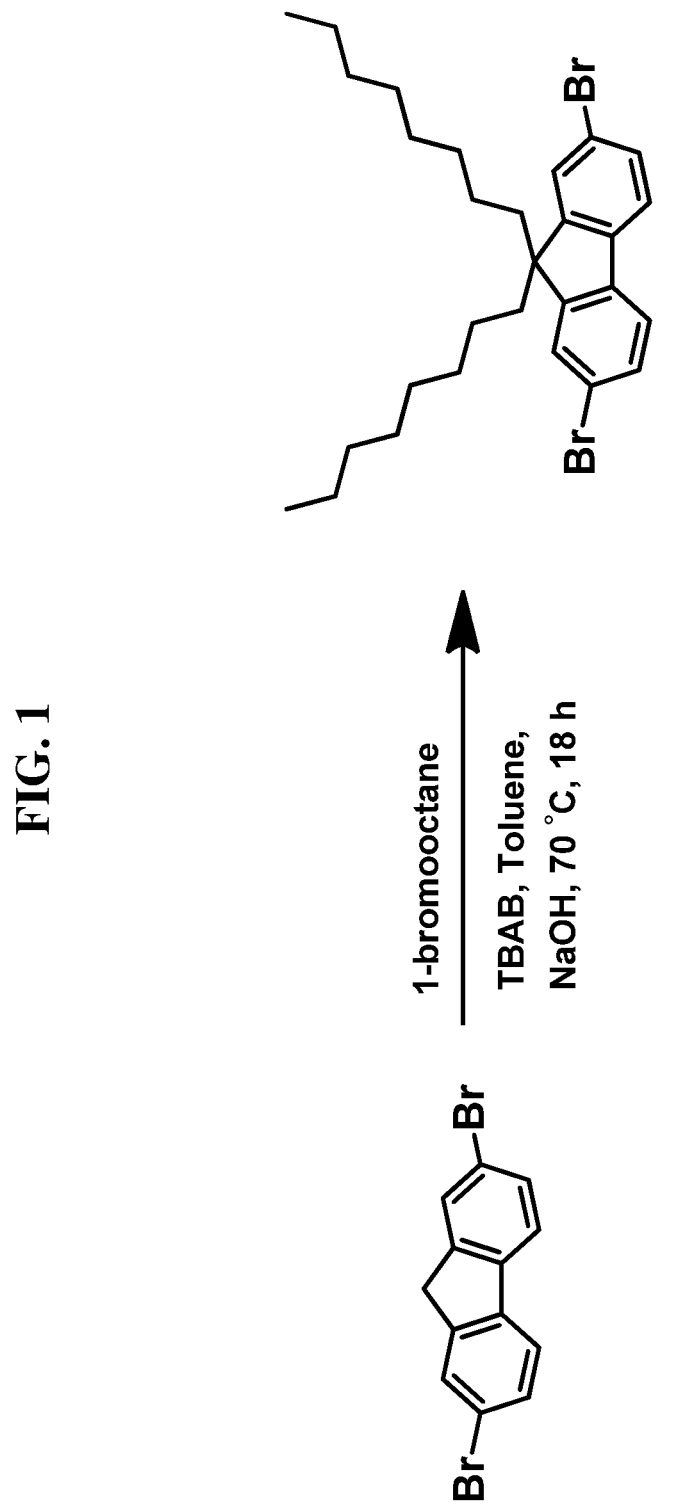
FIG. 1 is a diagram illustrating a synthesis reaction scheme of a fluorene monomer (2,7-dibromo-9H-fluorene-9,9-dioctane, F8) containing an alkyl chain.
Figure 2:
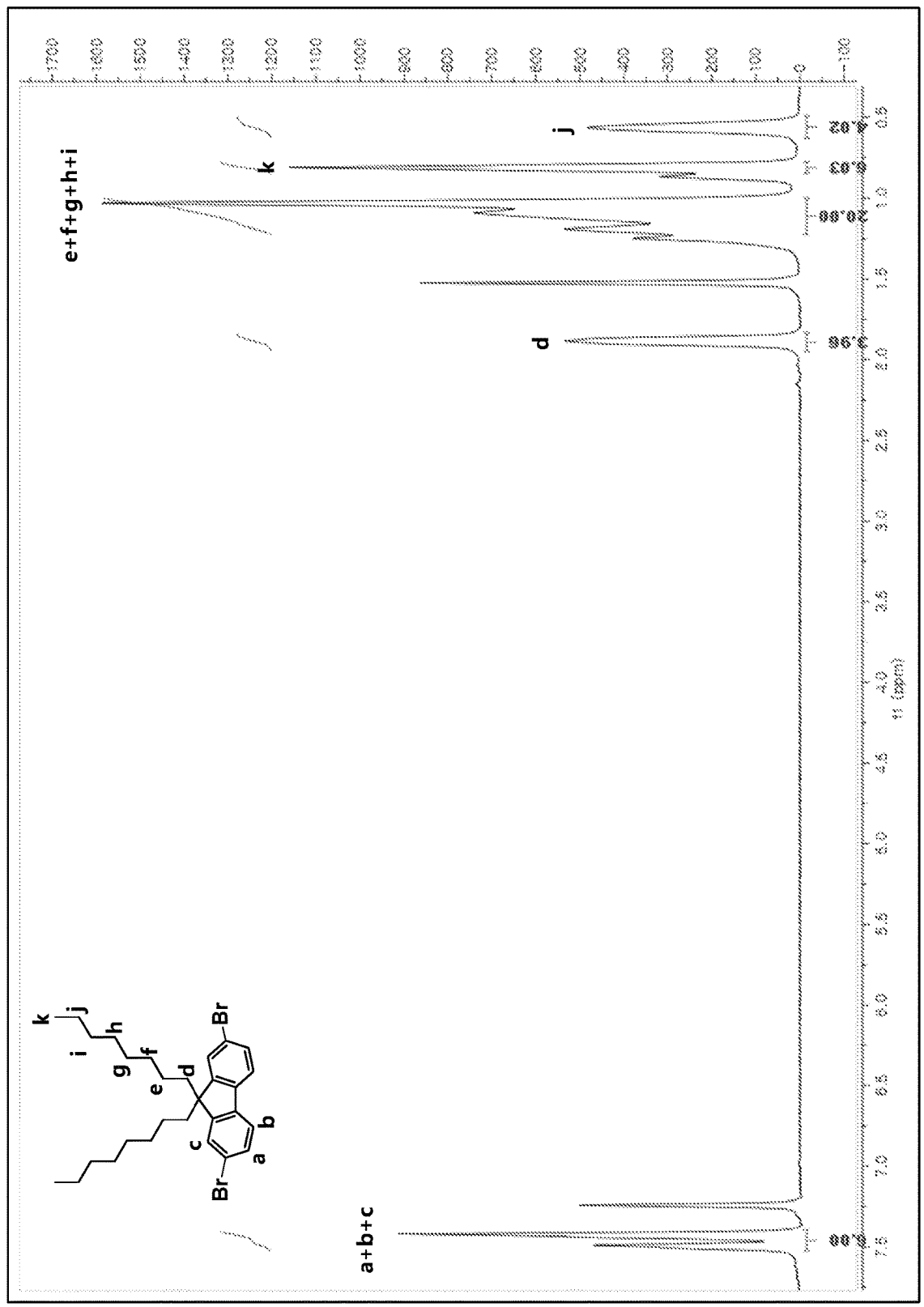
FIG. 2 is a diagram illustrating an NMR graph of a fluorene monomer (2,7-dibromo-9H-fluorene-9,9-dioctane, F8) containing an alkyl chain, synthesized according to Example 1.
Figure 3:
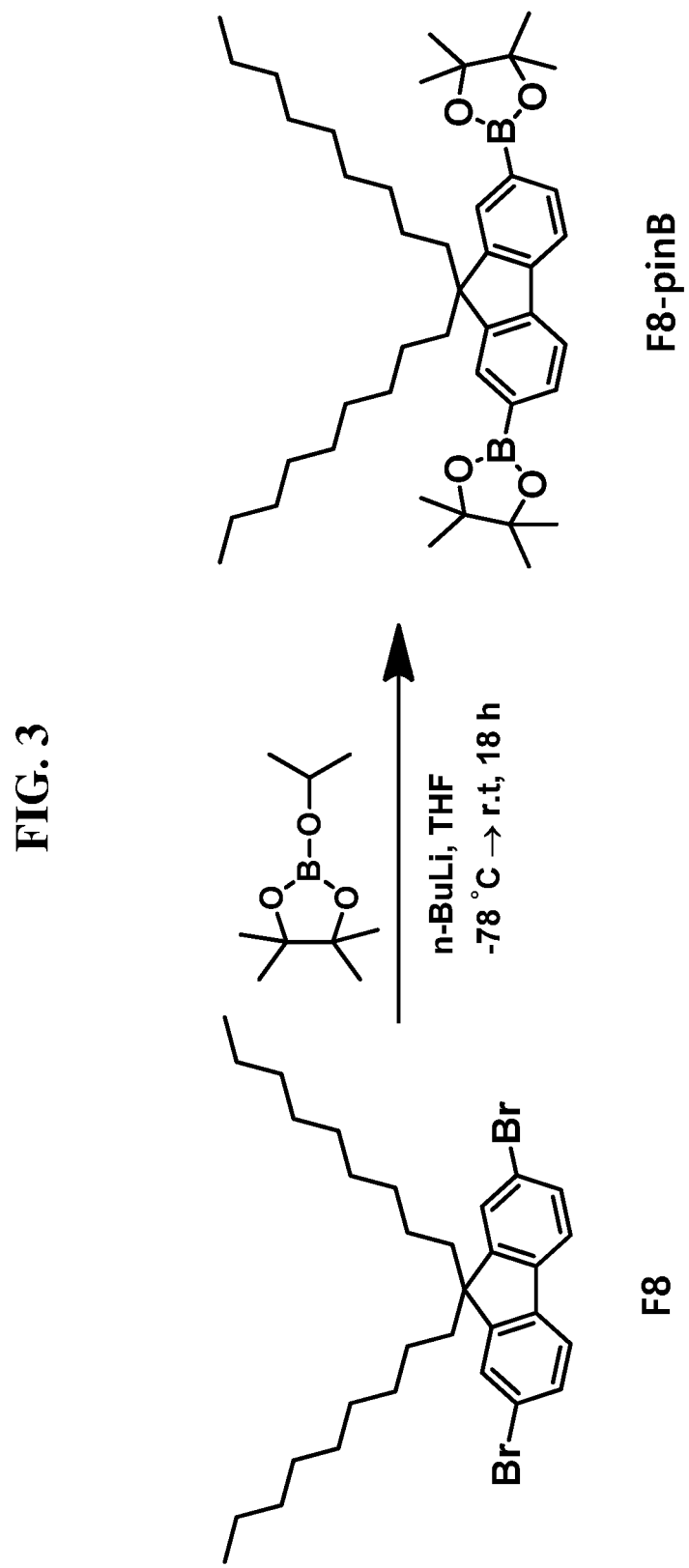
FIG. 3 is a diagram illustrating a synthesis reaction scheme of a fluorene monomer (9,9-dioctylfluorene-2,7-diboronic acid bis(pinacol) ester, F8-pinB) containing an alkyl chain and oxabrolane.
Figure 4:
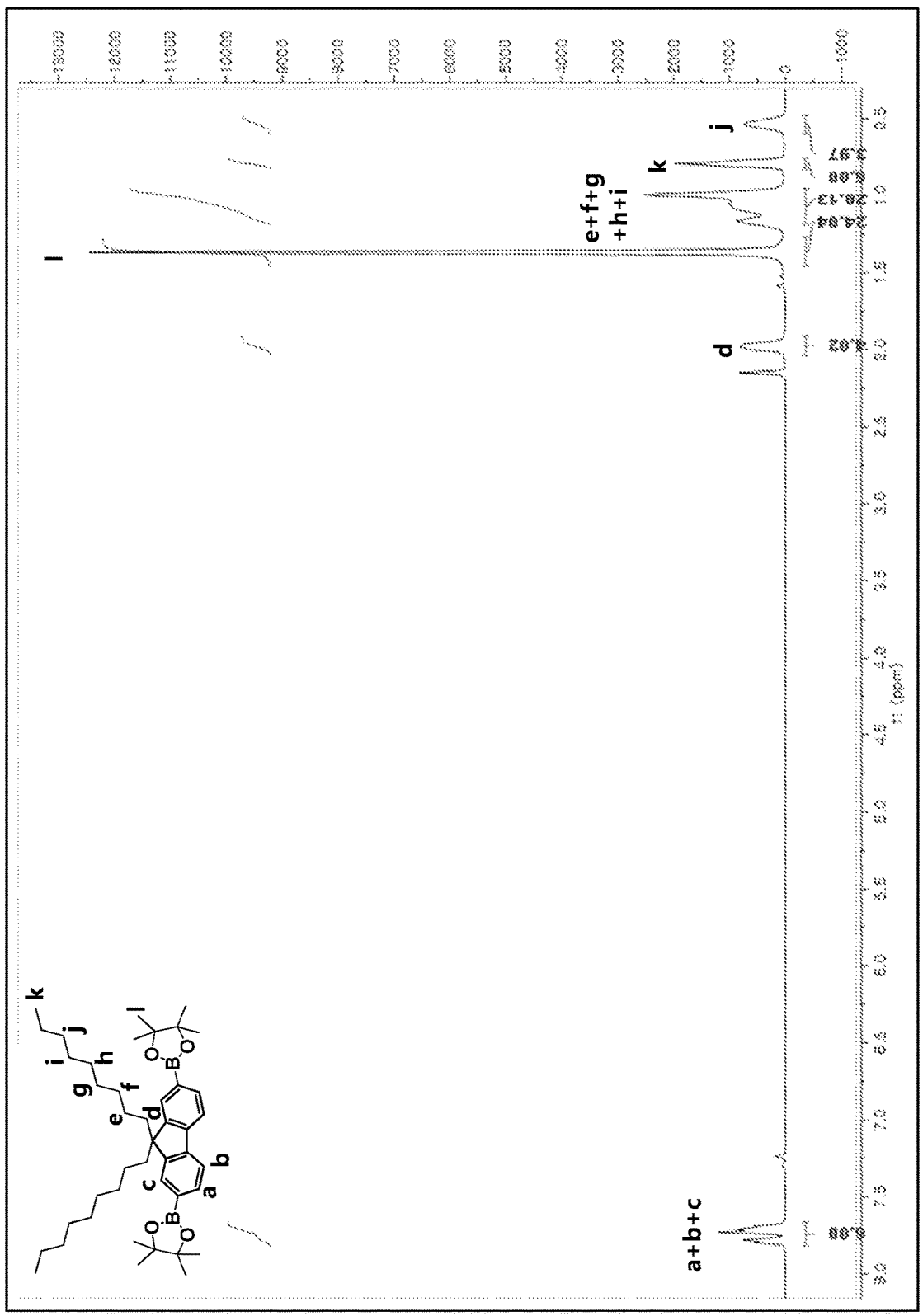
FIG. 4 is a diagram illustrating an NMR graph of a fluorene monomer (9,9-dioctylfluorene-2,7-diboronic acid bis(pinacol) ester, F8-pinB) containing an alkyl chain and oxabrolane, synthesized according to Example 2.
Figure 5:
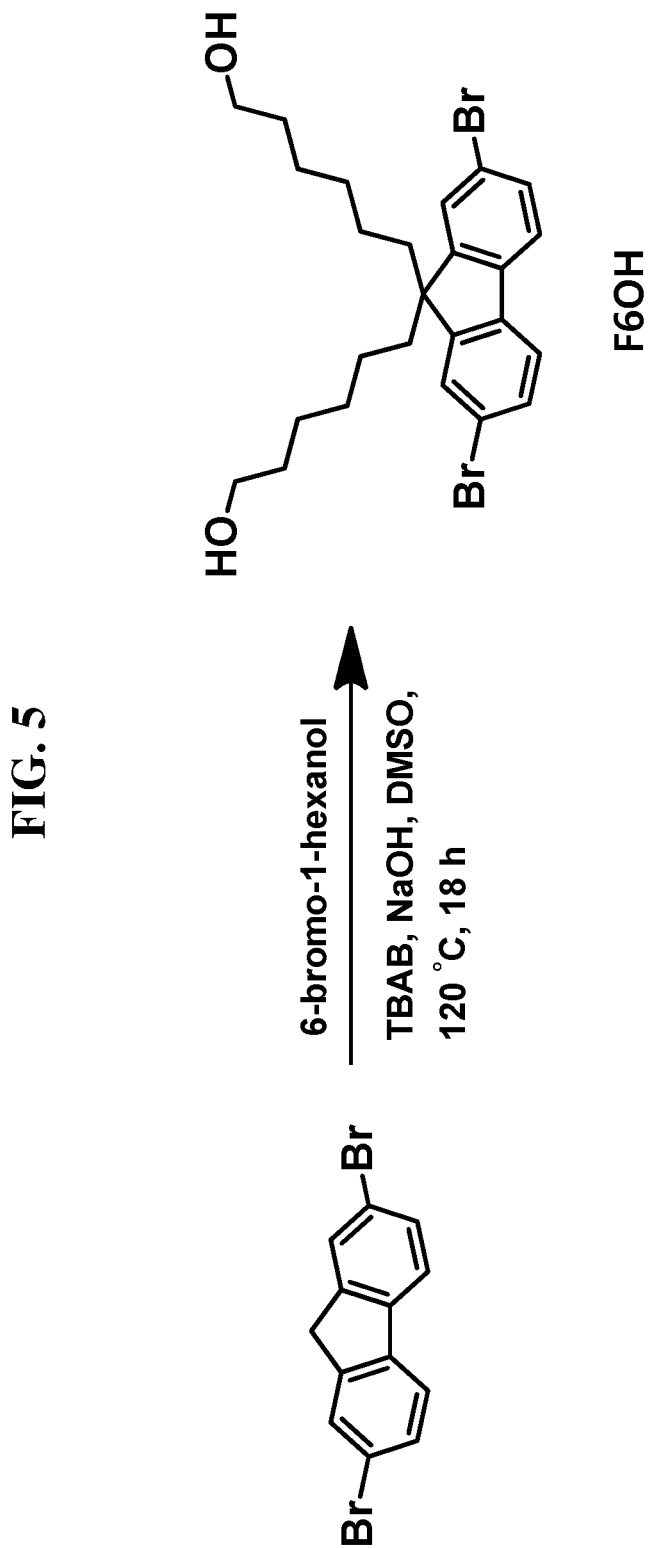
FIG. 5 is a diagram illustrating a synthetic reaction scheme of a fluorene monomer (2,7-dibromo-9H-fluorene-9,9-dihexanol, F6OH) containing a hydroxy group.
Figure 6:
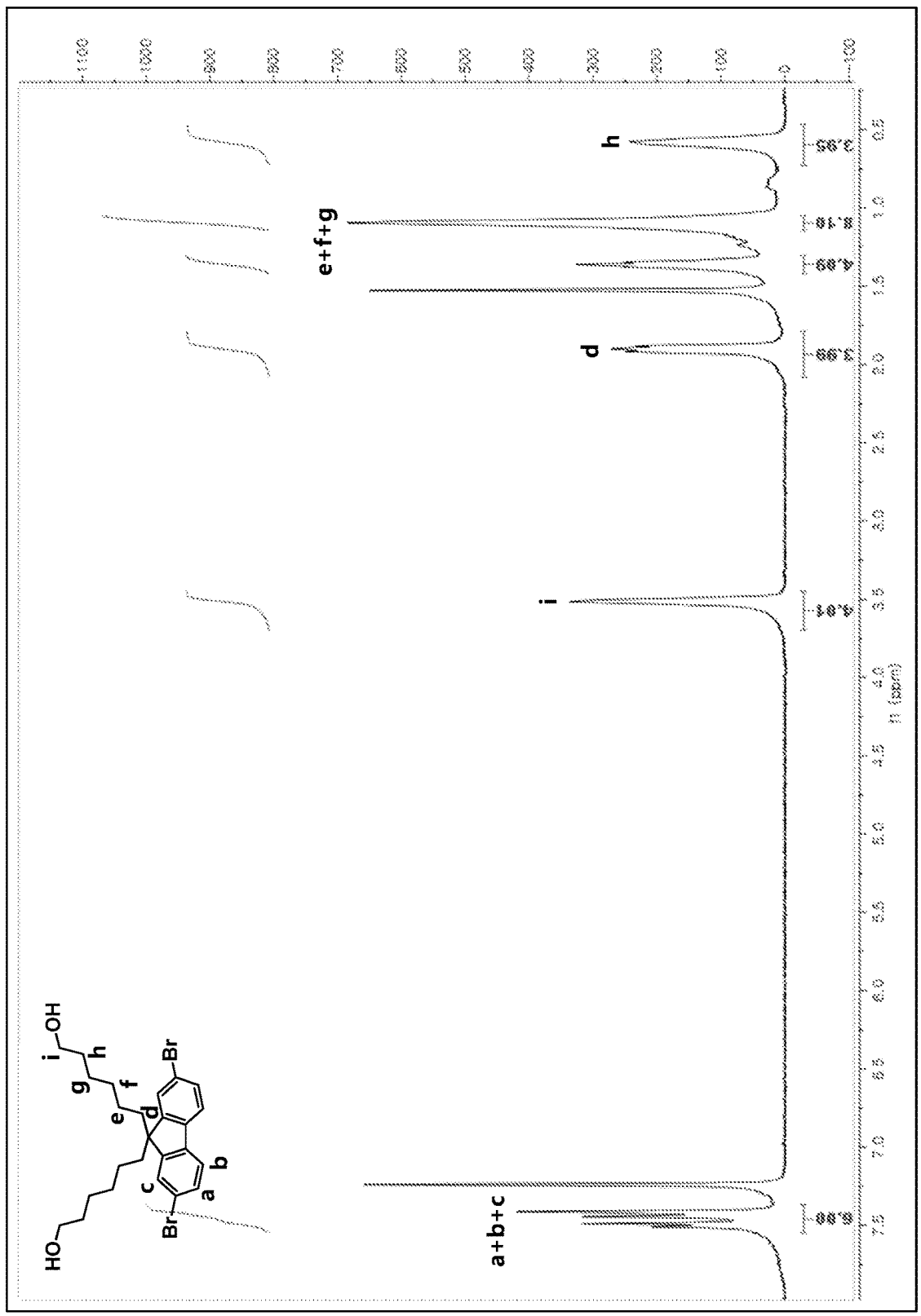
FIG. 6 is a diagram illustrating an NMR graph of a fluorene monomer (2,7-dibromo-9H-fluorene-9,9-dihexanol, F6OH) containing a hydroxy group, synthesized according to Example 3.
Figure 7:
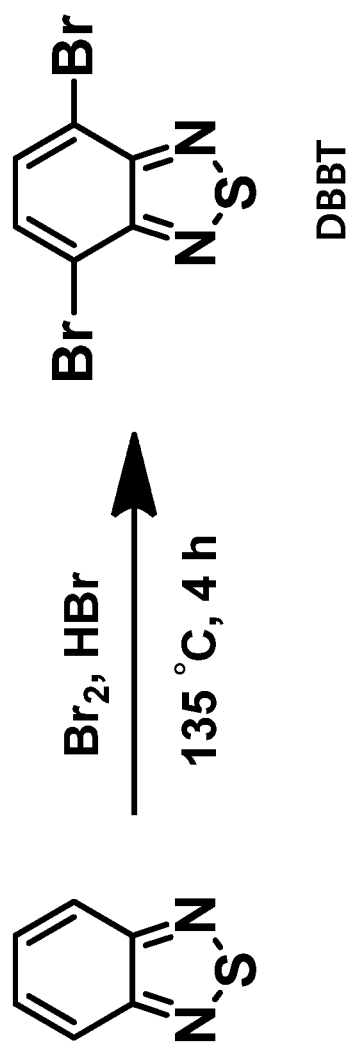
FIG. 7 is a diagram illustrating a synthesis reaction scheme of a benzothidiazole monomer (4,7-dibromo-2,1,3-benzothiadiazole, DBBT) used for the polymerization of a polyfluorene-based polymer emitting green light.
Figure 8:
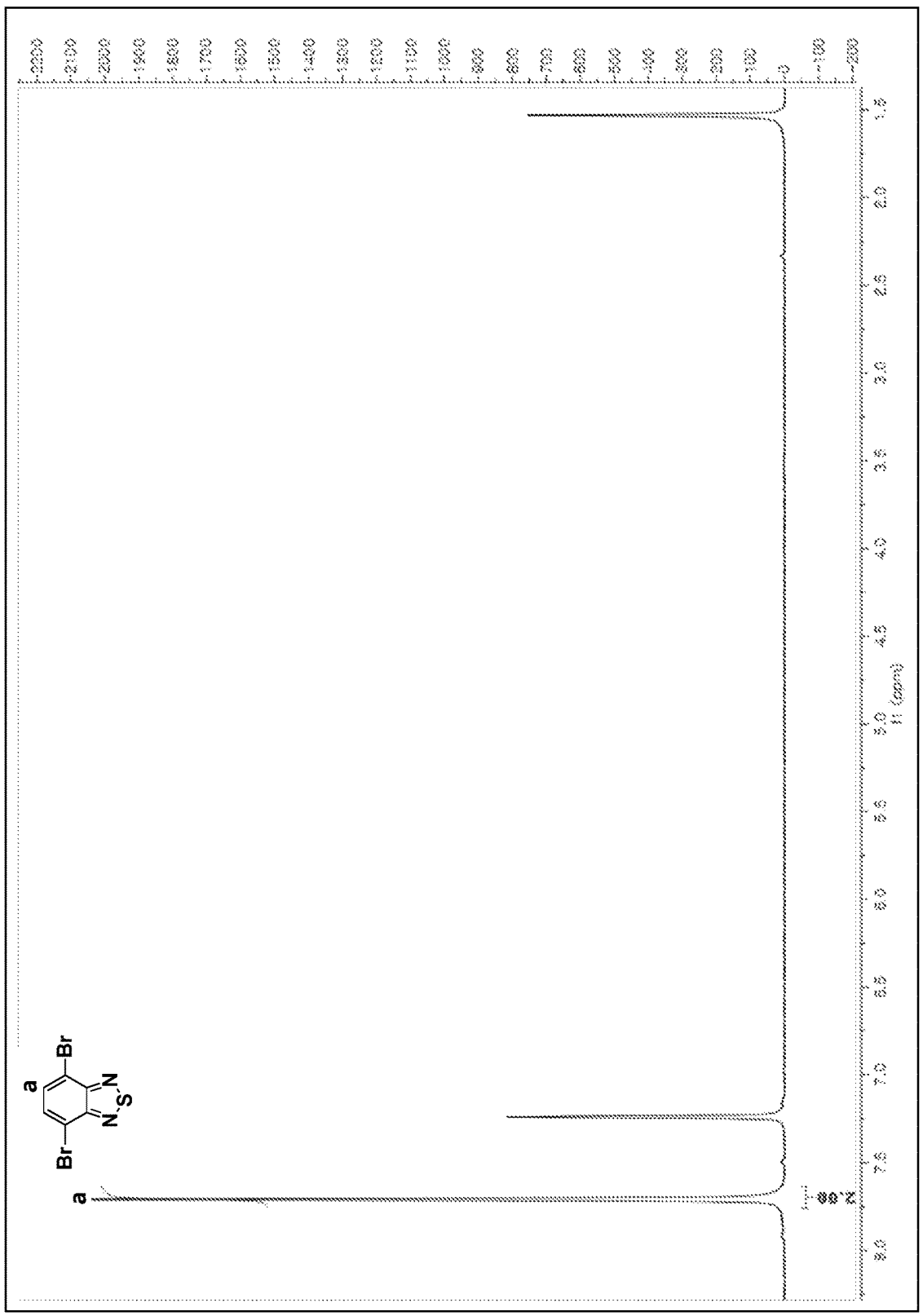
FIG. 8 is a diagram illustrating an NMR graph of a benzothidiazole monomer (4,7-dibromo-2,1,3-benzothiadiazole, DBBT) used for the polymerization of a polyfluorene-based polymer emitting green light, synthesized according to Example 4.
Figure 9:
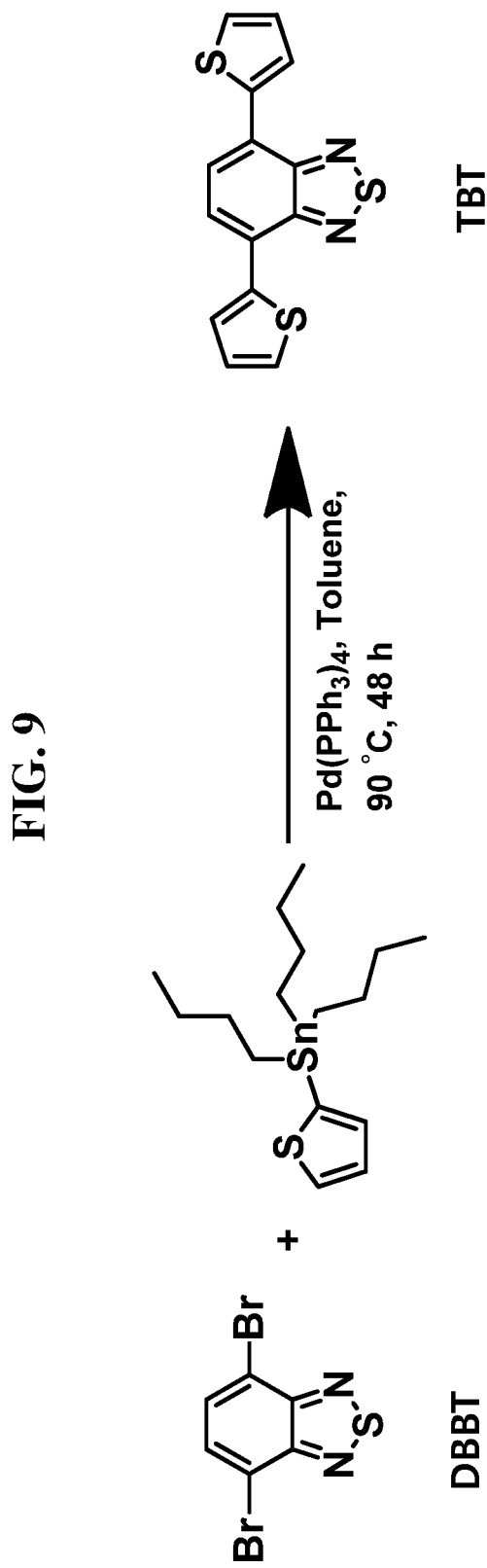
FIG. 9 is a diagram illustrating a synthesis reaction scheme of thiophene-benzothidiazole-thiophene (4,7-di-2-thienyl-2,1,3-benzothiadiazole, TBT) for synthesizing a monomer, 4,7-bis(5-bromo-2-thienyl)-2,1,3-benzothiadiazole (DBTBT).
Figure 10:
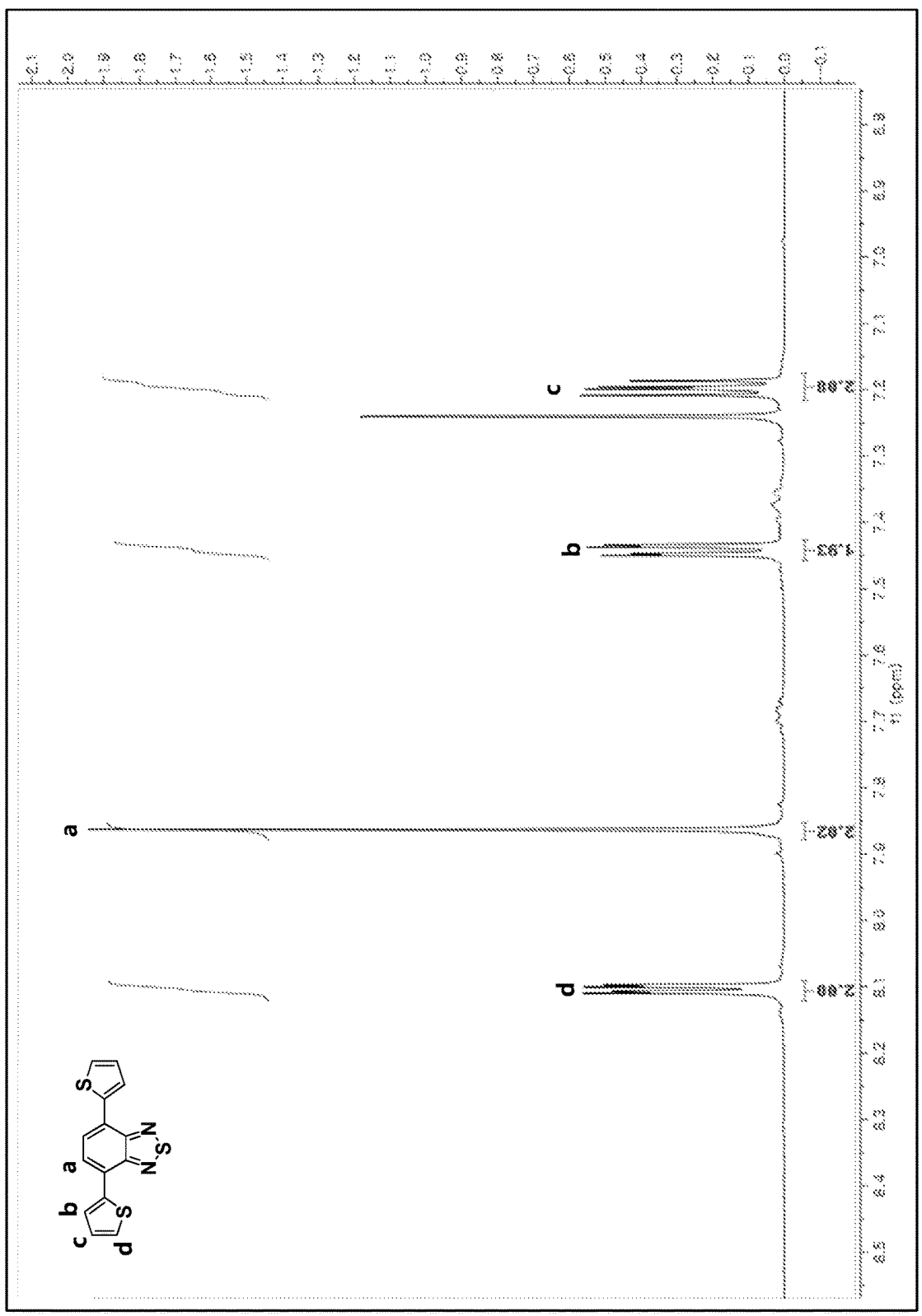
FIG. 10 is a diagram illustrating an NMR graph of thiophene-benzothidiazole-thiophene (4,7-di-2-thienyl-2,1,3-benzothiadiazole, TBT) synthesized according to Example 5.
Figure 11:
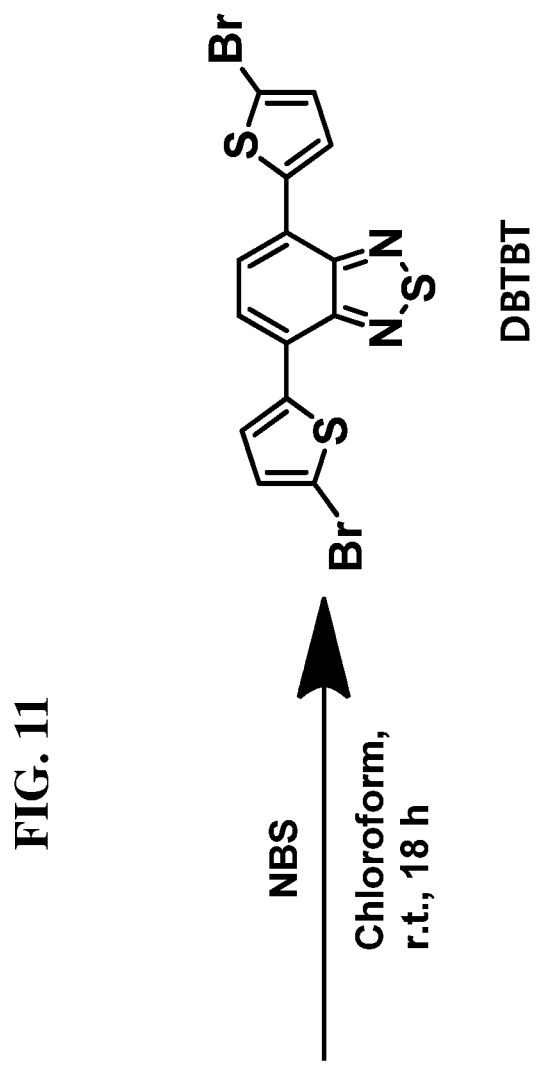
FIG. 11 is a diagram illustrating the synthesis reaction scheme of a thiophene-benzothidiazole-thiophene monomer (4,7-bis(5-bromo-2-thienyl)-2,1,3-benzothiadiazole, DBTBT) used for polymerization of a polyfluorene-based polymer emitting red light.
Figure 12:
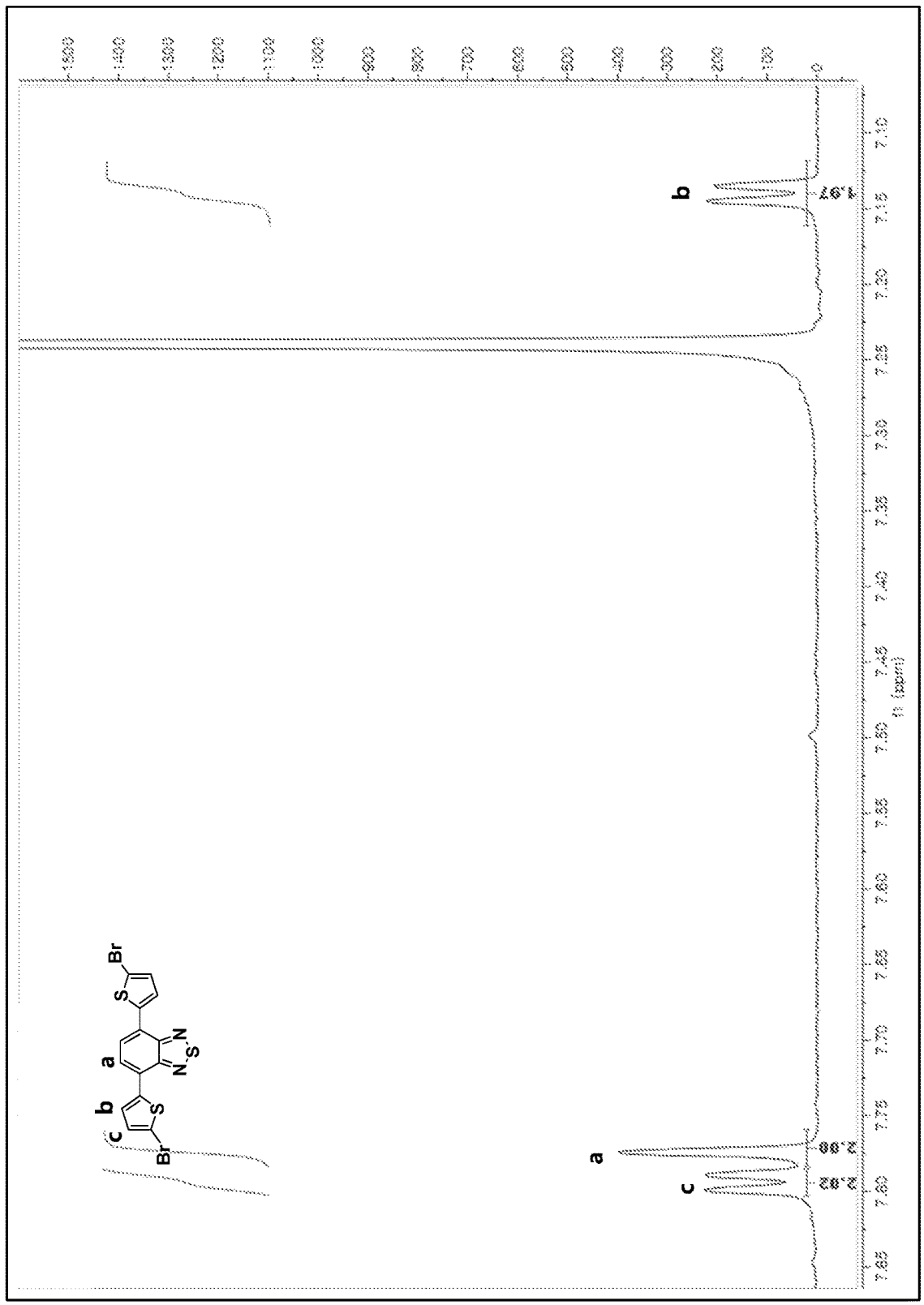
FIG. 12 is a diagram illustrating an NMR graph of a thiophene-benzothidiazole-thiophene monomer (4,7-bis(5-bromo-2-thienyl)-2,1,3-benzothiadiazole, DBTBT) used for the polymerization of a polyfluorene-based polymer that emits red light, synthesized according to Example 6.
Figure 13:
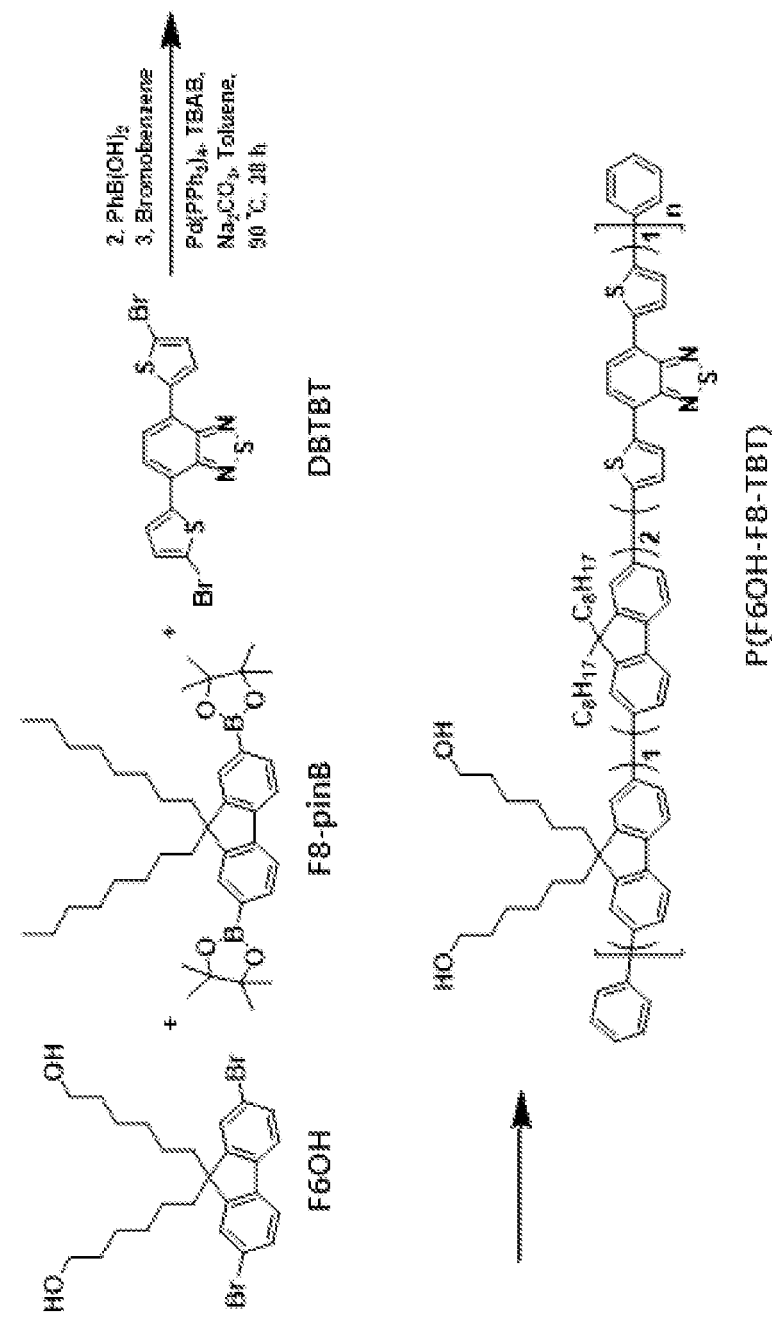
FIG. 13 is a diagram illustrating a synthesis reaction scheme of a polyfluorene-based polymer [polydihexanol fluorene-dioctyl fluorene-(thiophenebenzothiadiazole-thiophene), P(F6OH—F8-TBT)] that contains a hydroxy group and emits red light.

The present disclosure may be variously modified and have several forms. Therefore, specific exemplary embodiments of the present disclosure will be illustrated in the accompanying drawings and be described in detail in the present specification. However, it is to be understood that the present disclosure is not limited to a specific disclosed form, but includes all modifications, equivalents, and substitutions without departing from the scope and sprit of the present disclosure.

It should be understood that term "comprise" or "have" as used herein, specifies the presence of features, numerals, steps, operations, components, parts mentioned herein, or a combination thereof, but does not preclude the presence or addition of one or more other features, numerals, steps, operations, components, parts, or a combination thereof.

In the present specification, "single SPL (synchronized piezoelectric & luminescence) material" refers to an artificial synesthesia electronics material that implements both piezoelectricity and luminescence with one material.

In the present specification, "aryl(ene) having 6 to 30 ring carbon atoms" refers to a monocyclic or fused-ring system radical derived from an aromatic hydrocarbon having 6 to 30 ring carbon atoms, and preferably 6 to 20 ring carbon atoms. Examples thereof include phenyl, biphenyl, naphthyl, phenylnaphthyl, fluorenyl, phenanthrenyl, anthracenyl, indenyl, etc.

In the present specification, "heteroaryl(ene) having 2 to 30 ring carbon atoms" refers to an aryl group having 2 to 30 ring carbon atoms and one or more heteroatoms selected from N, O, S, and Si, and it may be a monocyclic system or a fused ring system, and may also be partially saturated. Preferably, the number of ring atoms including carbon may be 5 to 30, where the number of heteroatoms may be 1 to 4. In addition, in the present specification, the heteroaryl(ene) also includes a form in which one or more heteroaryl or aryl groups are linked to a heteroaryl group by a single linkage. Examples of the heteroaryl(ene) include furyl, thiophenyl, imidazolyl, pyrazolyl, thiazolyl, thiadiazolyl, isothiazolyl, isoxazolyl, benzothiadiazolyl, benzothiophenyl, dibenzofuranyl, benzonaphthothiophenyl, benzothiazolyl, benzoisothiazolyl, benzoisoxazolyl, quinazolinyl, etc.

In the present specification, "substituted" in the expression "substituted or unsubstituted" means that that a hydrogen atom in a functional group is replaced with another atom or another functional group (i.e., a substituent). Examples of the substituent may include a halogen atom, a cyano group, a carboxyl group, a hydroxy group, an alkyl group having 1 to 30 carbon atoms, an alkyl group having 1 to 30 carbon atoms substituted by a halogen atom, an alkenyl group having 2 to 30 carbon atoms, an alkynyl group having 2 to 30 carbon atoms, etc.

In the present disclosure, in order to synthesize a graft copolymer of polyfluorene-based polymer and a PVDF, a macro chain transfer agent (Macro CTA) was synthesized, and a polyfluorene-PVDF graft copolymer that maintains luminescence properties was polymerized through RAFT polymerization. A copolymer containing the PVDF as a side branch was developed while maintaining excellent luminescence properties of the polyfluorene-based polymer emitting light of red, green, and blue light. However, the polymerization method of the present disclosure is not limited thereto.

This polymer may increase miscibility between two polymers when a composite is formed, because the polyfluorene-based polymer and the PVDF having poor miscibility exists in one molecule. Therefore, it is possible to form the composite with excellent performance and form a film having excellent uniformity in forming a film through a solution process. In addition, the PVDF exhibiting piezoelectricity and the polyfluorene exhibiting luminescence properties are present in one molecule, which may result in a single piezoelectric-luminescence property.

If the miscibility between these two polymers is poor, it is very difficult to form a composite and a film, and a device manufactured using the two polymers has poor performance. Thus, it is necessary to have excellent miscibility when the two polymers are formed into a composite or a film is manufactured. There are several ways to increase the miscibility between two polymers, one of which is to increase the miscibility by using a polymerized copolymer by introducing a monomer that has affinity and servers as dispersants or surfactants into the two polymers. Thus, in order to increase the miscibility between the PVDF and the polyfluorene-based polymer, a graft copolymer containing the polyfluorene-based polymer as a main chain and the PVDF as a side chain was developed.

A synthesis method of the graft copolymer includes: "graft-to" that links the previously synthesized side chain to the main chain, "graft from" that allows the side chain to grow in the main chain, and "graft-through" that links a monomer having a large molecular weight due to the side chain attached thereto to a monomer having a small size. Among the three synthesis methods, it was determined that the graftform method, which allows the side chain to grow in the main chain, was suitable in order to introduce the PVDF into the linear alkyl chain of a fluorene monomer.

In general, the PVDF is synthesized through radical polymerization in a high-pressure reactor using a vapor-phase vinylidene fluoride (VDF) monomer. The radical polymerization uses various types of polymerization method such as free radical, reversible addition-fragmentation chain transfer (RAFT) polymerization, and iodine transfer polymerization (ITP). In the case of the free radical polymerization, it is difficult to control the molecular weight and molecular weight distribution (polydispersity index (PDI)). Therefore, a polymerization method such as RAFT polymerization or ITP, in which the molecular weight and molecular weight distribution of the polymer may be easily controlled, is often used. In addition, in the case of the free radical polymerization, since the PVDF cannot be introduced at a desired location, a method such as the RAFT polymerization or ITP polymerization need to be used for the synthesis of the copolymer. Thus, in order to synthesize the PVDF and the polyfluorene-based copolymer, the xanthate group, which is the chain transfer agent used in the RAFT polymerization of the PVDF, needs to exist in the polyfluorene-based polymer, which is the main chain. It was determined that the graft copolymer may be synthesized through the radical polymerization in the high-pressure reactor by using the polyfluorene-based polymer in which the xanthate group is introduced as a Macro CTA.

Based on the above-mentioned problem recognition and direction to overcome, in present disclosure, (1) three polyfluorene-based polymers emitting light of red, green, and blue light and contain a hydroxy group were synthesized, (2) Macro CTAs (red, green, blue) were synthesized by introducing the xanthate groups into the three polyfluorene-based polymers through esterification, (3) a polyfluorene-based polymer-PVDF graft copolymer was synthesized through RAFT polymerization in the high-pressure reactor, and (4) the synthesized PVDF graft copolymer was manufactured as an element to measure luminescence performance and hysteresis loop, respectively.

Hereinafter, a polyfluorene-based polymer-polyvinylidene fluoride graft copolymer according to an embodiment will be described.

The polyfluorene-based polymer-polyvinylidene fluoride graft copolymer according to an embodiment is represented by the following Formula 1:

[Formula 1]

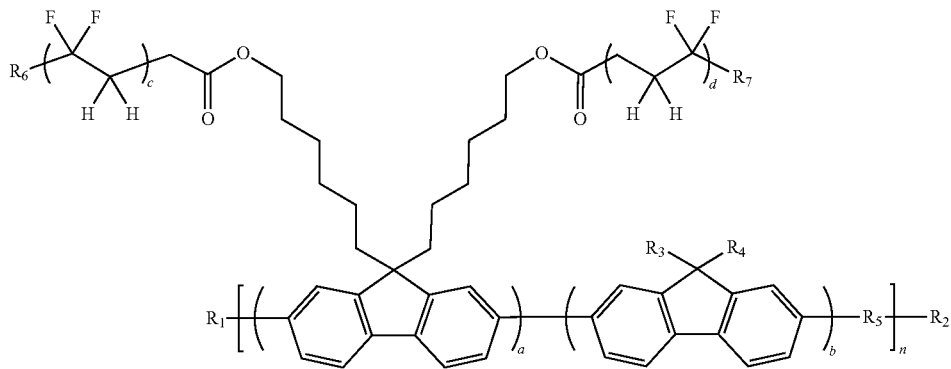

wherein $R_1$ and $R_2$ may each independently be a hydrogen atom, a deuterium atom, a halogen atom, a cyano group, a substituted or unsubstituted aryl group having 6 to 30 ring carbon atoms, or a substituted or unsubstituted heteroaryl group having 2 to 30 ring carbon atoms; specifically, $R_1$ and $R_2$ may each independently be a substituted or unsubstituted aryl group having 6 to 30 ring carbon atoms, more specifically, an aryl group which has 6 to 20 carbon atoms and is unsubstituted or substituted by a halogen atom or an alkyl group having 1 to 10 carbon atoms; and still more particularly, a substituted or unsubstituted phenyl group. According to an embodiment, $R_1$ and $R_2$ may be the same as each other. $R_3$ and $R_4$ may each independently be a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms; specifically, a substituted or unsubstituted alkyl group having 1 to 10 carbon atoms, more specifically, an alkyl group which has 1 to 10 carbon atoms and is unsubstituted or substituted by a halogen atom; and still more specifically, a substituted or unsubstituted octyl group. According to an embodiment, $R_3$ and $R_4$ may be the same as each other. According to an embodiment, $R_3$ and $R_4$ are may be the same as each other, and may be an alkyl group which has 1 to 10 carbon atoms and is unsubstituted or substituted by a halogen atom.

$R_5$ may be a direct linkage, a substituted or unsubstituted arylene group having 6 to 30 ring carbon atoms, or a substituted or unsubstituted heteroarylene group having 2 to 30 ring carbon atoms; specifically, a direct linkage, or a substituted or unsubstituted heteroarylene group having 2 to 30 ring carbon atoms; more specifically, a direct linkage, or a heteroaylene group unsubstituted or substituted by a halogen atom or an alkyl group having 1 to 10 carbon atoms, and has 2 to 30 ring carbon atoms and 1 to 4 heteroatoms, wherein the heteroatom is at least one selected from N and S; and still more specifically, a direct linkage, or a substituted or unsubstituted benzothiadiazolylene group or a substituted or unsubstituted benzothiadiazolylene group in which a substituted or unsubstituted thiophenyl is linked to both sides.

$R_6$ and $R_7$ may each independently be a hydrogen atom, a deuterium atom, a halogen atom, a cyano group, a substituted or unsubstituted alkyl group having 1 to 10 carbon atoms, a substituted or unsubstituted alkyl xanthate group having 1 to 10 carbon atoms, or a substituted or unsubstituted aryl group having 6 to 30 ring carbon atoms; specifically, an alkyl xanthate group which has 1 to 10 carbon atoms and is unsubstituted or substituted by a halogen atom or an alkyl group having 1 to 10 carbon atoms; and more specifically, $R_6$ and $R_7$ may be the same as each other, and may be an alkyl xanthate group which has 1 to 10 carbon atoms and is substituted by a halogen atom, for example, a fluorine atom.

a, b, c, and d may each independently be an integer of 1 to 3, and n may be an integer of 1 to 5.

Accordingly, the polyfluorene-based polymer-polyvinylidene fluoride graft copolymer according to an embodiment represented by Formula 1 may be represented by any one of the following Formulas 1-1 to 1-3:

[Formula 1-1]

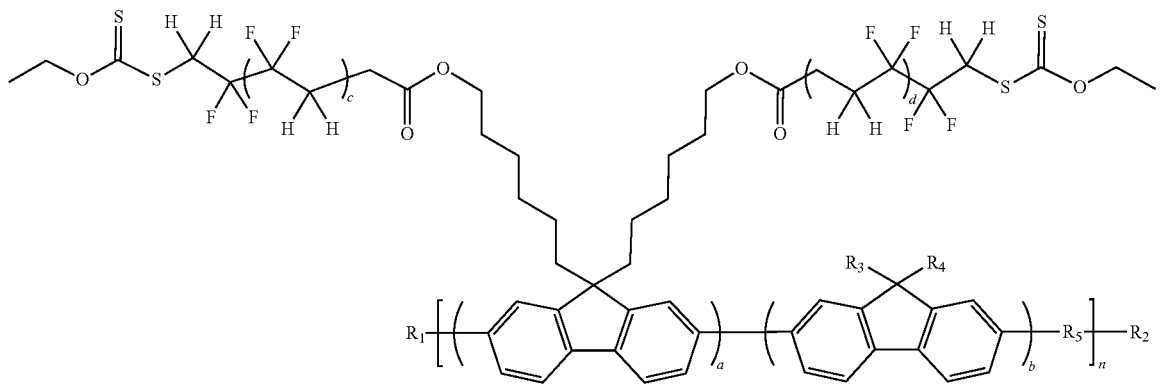

[Formula 1-2]
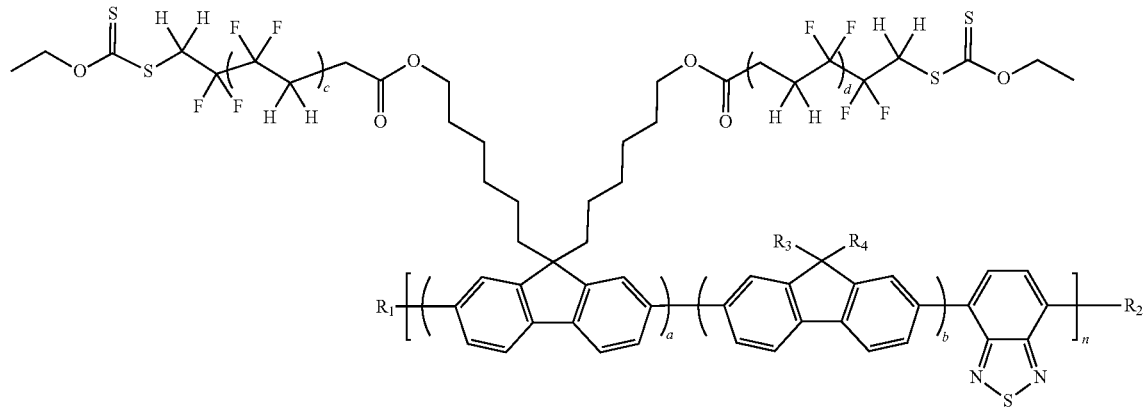
[Formula 1-3]
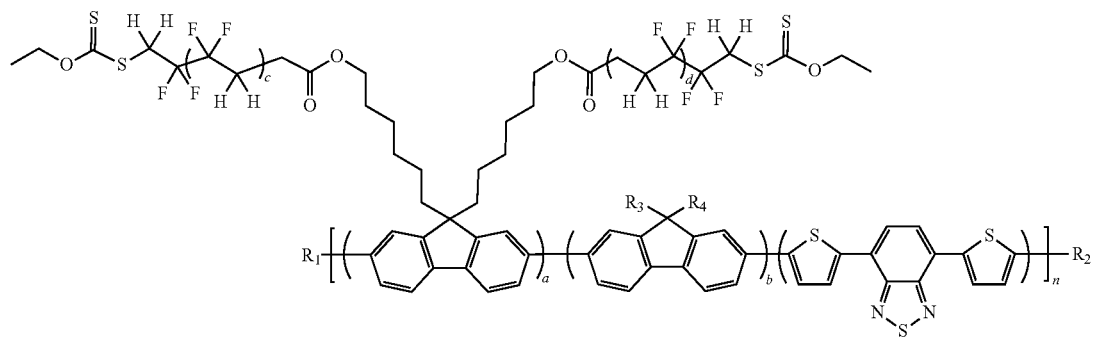
wherein $R_1$ to $R_4$, a to d, and n may be as described in Formula 1.
Specifically, the polyfluorene-based polymer-polyvinylidene fluoride graft copolymer according to an embodiment represented by Formula 1 may be represented by any one of the following Formulas 1-4 to 1-6. However, the embodiment is not limited thereto.
[Formula 1-4]
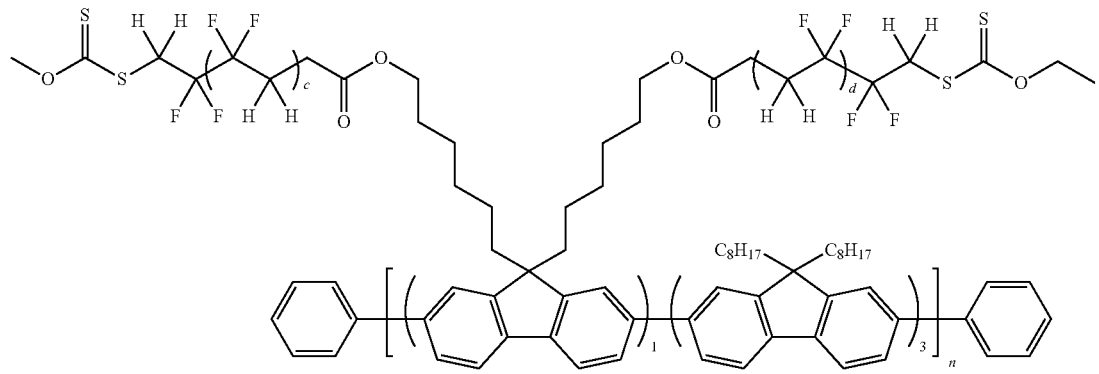

[Formula 1-5]

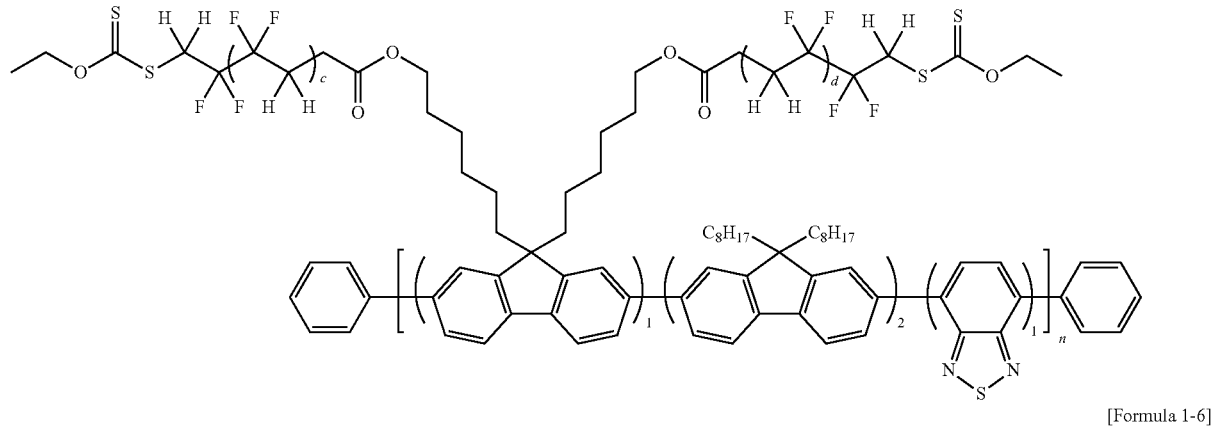

[Formula 1-6]

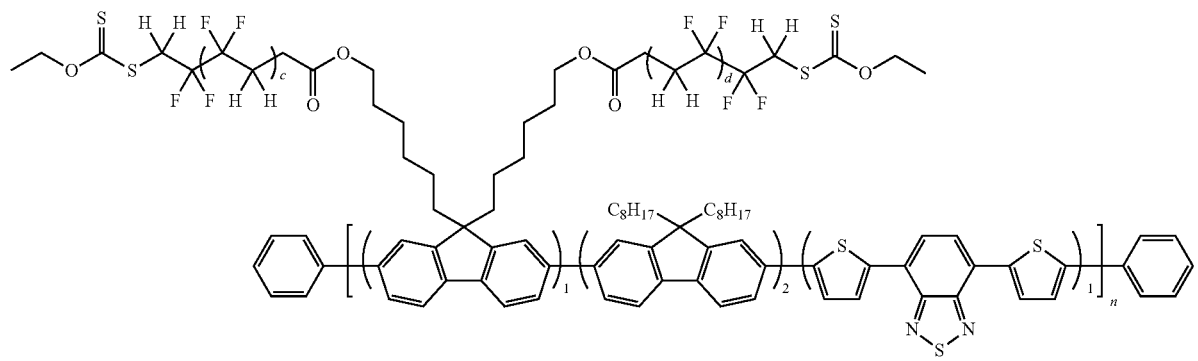

Wherein c, d, and n may be as described in Formula 1.

Because the polyfluorene-based polymer-polyvinylidene fluoride graft copolymer of the above-described embodiment has both the piezoelectric properties and the luminescence properties, the polyfluorene-based polymer-polyvinylidene fluoride graft copolymer may visualize various input signals, such as sound, touch, and temperature, and apply the various input signals to efficient communication. Therefore, the polyfluorene-based polymer-polyvinylidene fluoride graft copolymer may be usefully used for the next-generation future-oriented wearable synesthesia element.

Such a synesthesia element includes various elements used in all fields such as industrial and commercial fields, a medical field, a vehicle, and a personal computer (PC). Examples of the synesthesia element may include a stretchable element. Since the stretchable element may be operated even when the substrate is contracted or stretched by manufacturing an existing photoelectric element on a stretched substrate, it may create various application fields and may be variously used as a core component material for implementing a wearable electronic element, an electronic skin, Internet of things (IoT), an electronic element for a vehicle, and an artificial intelligence (AI) robot.

Hereinafter, an element according to an embodiment of the present disclosure will be described. Hereinafter, the polyfluorene-based polymer-polyvinylidene fluoride graft copolymer according to an embodiment of the present disclosure described above will not be described in detail, and parts that are not described will be replaced by the description of the polyfluorene-based polymer-polyvinylidene fluoride graft copolymer according to an embodiment of the present disclosure described above.

For example, the polyfluorene-based polymer-polyvinylidene fluoride graft copolymer according to the present disclosure may be applied to a light emitting layer of a light emitting element. This element includes a substrate; a first electrode disposed on the substrate; a light emitting layer disposed on the first electrode; and a second electrode disposed on the light emitting layer, wherein the light emitting layer may include a polyfluorene-based polymer-polyvinylidene fluoride graft copolymer represented by the following Formula 1.

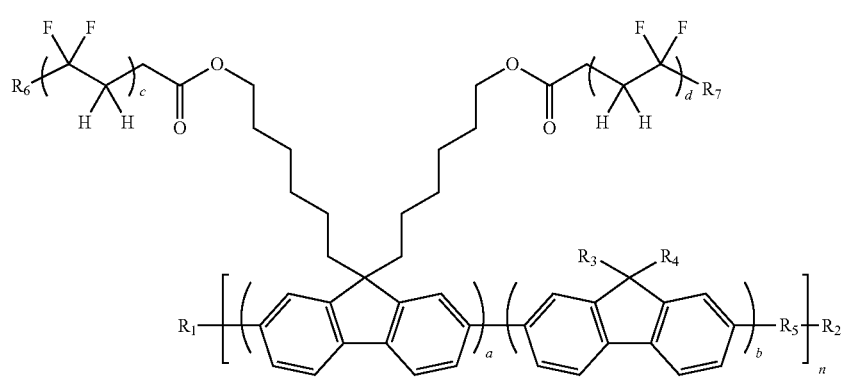
[Formula 1]
wherein $R_1$, $R_2$, $R_3$, $R_4$, $R_5$, $R_6$, $R_7$, a, b, c, d, and n are as described in Formula 1.
Formula 1 may be represented by any one of the following Formulas 1-4 to 1-6:
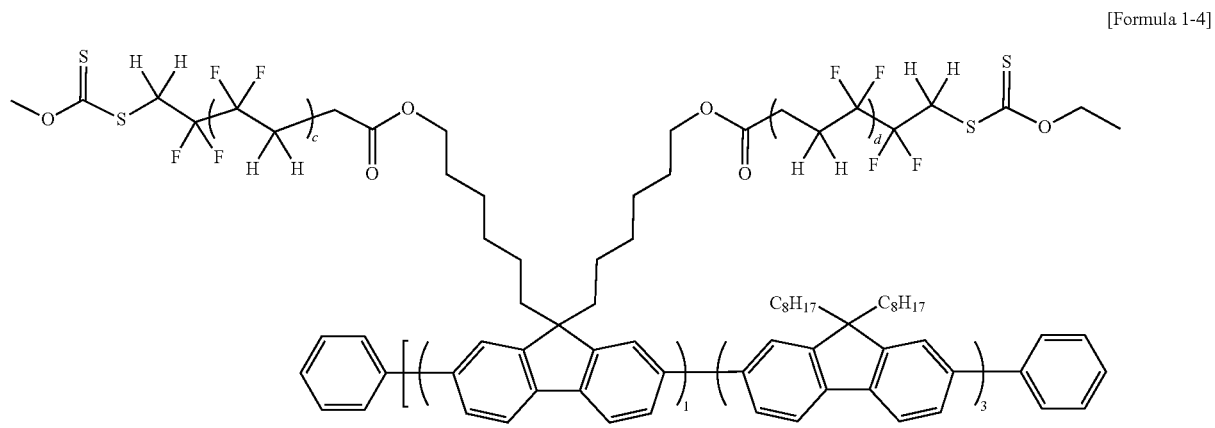
[Formula 1-4]
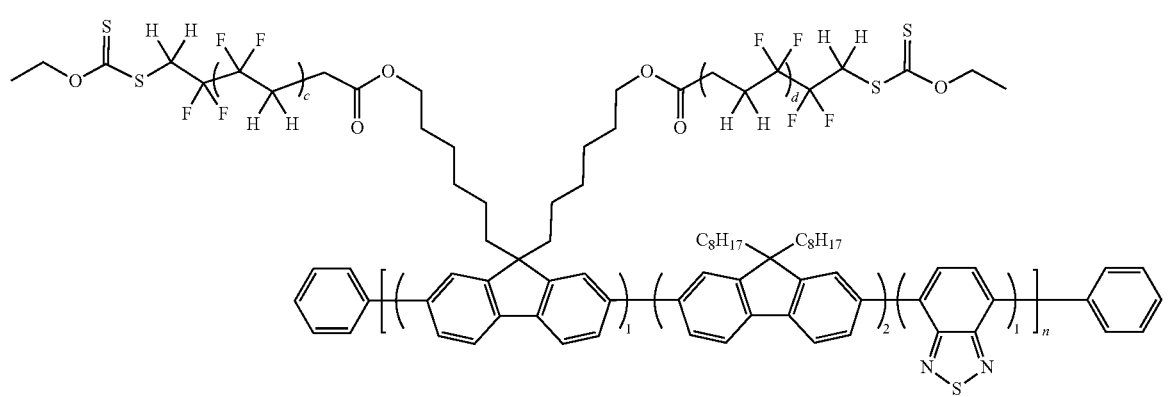
[Formula 1-5]

[Formula 1-6]

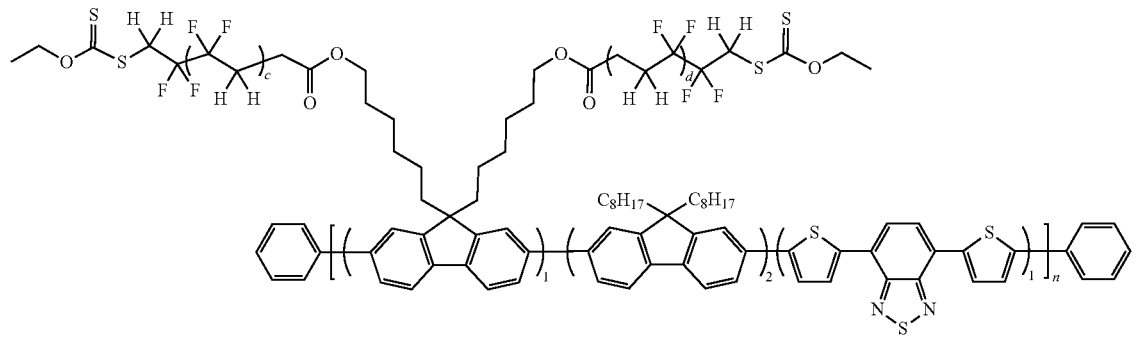

wherein c, d, and n may be as described in Formula 1.

Herein, the copolymer represented by Formula 1-4 may emit blue light, the copolymer represented by Formula 1-5 may emit green light, and the copolymer represented by Formula 1-6 may emit red light.

The substrate may be a flexible substrate, and the flexible substrate may be, for example, a polyimide substrate, a PEN substrate, etc.

The first electrode layer and the second electrode layer may be selected from the group consisting of gold, silver, copper, graphene, silicon nanowires, carbon nanotubes, and indium tin oxide.

According to an embodiment of the present disclosure, the element may exhibit both piezoelectricity and luminescence.

According to another embodiment of the present disclosure, the element may be used for a wearable electronic device, an electronic skin, or an electronic device for a vehicle.

Hereinafter, the present disclosure will be described in detail through examples, but the following examples and experimental examples are merely illustrative of one form of the present disclosure, and the scope of the present disclosure is not limited by the following examples and experimental examples.

[Monomer for Synthesizing Polymer Emitting Light of Three Colors of Red, Green, and Blue]

Before preparing a polyfluorene-based polymer, monomers required for each polymer were synthesized. In the light emitting polymer, a F6OH, a F8, and a F8-pinB, which act as a donor, and a DBBT and a DBTBT, which act as an acceptor, were synthesized, respectively. In particular, since the polyfluorene-based polymer should have a hydroxy group in order to prepare a Macro CTA, a F6OH was synthesized.

[Formula 2]

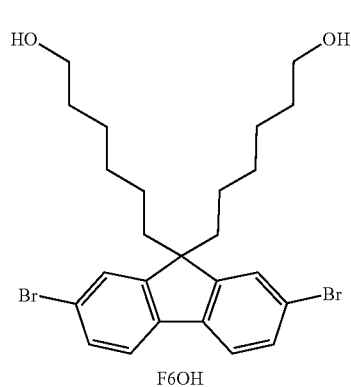

F6OH

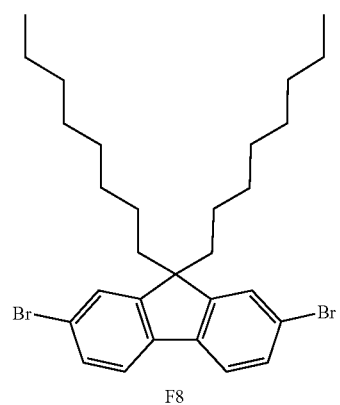

F8

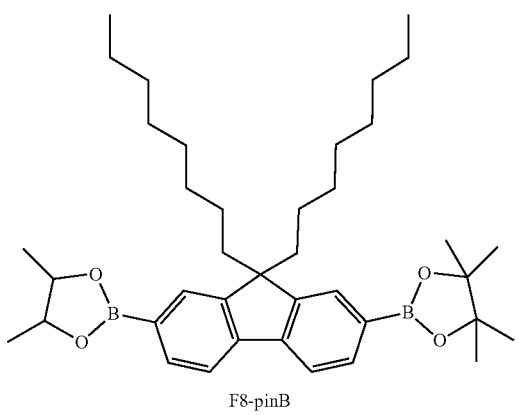

F8-pinB

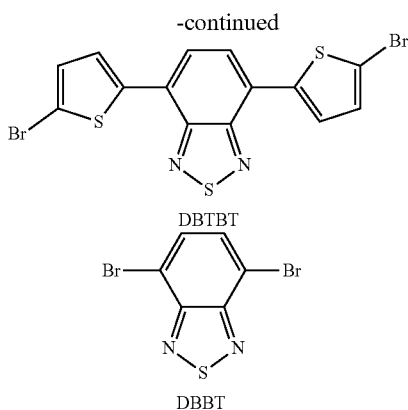

DBTBT

DBBT

<Example 1> Synthesis of Fluorene Monomer F8 Containing Alkyl Chain

To a Schlenk-flask (250 cm$^3$) were added 2,7-dibromo fluorene (5.00 g, 15.4 mmol), bromo-octane (7.45 g, 38.6 mmol), tetra-butyl ammonium bromide (0.25 g, 0.77 mmol), and sodium hydroxide (15.0 g). Then, toluene (20 cm$^3$) subjected to bubbling with nitrogen gas was added thereto under nitrogen conditions. All oxygen in the solution was removed by repeating freeze-pump thaw processes three times. Thereafter, the reaction mixture was stirred at 70° C. for 10 minutes, and then distilled water (15 cm$^3$) was added and stirred at 70° C. for 18 hours. After cooling down to room temperature, the reaction mixture was extracted with hexane, and the hexane solution was washed with water and a saturated aqueous sodium chloride solution. Anhydrous MgSO$_4$ was added to the separated organic solution and stirred to remove moisture in the product. After filtration, the concentrated product was purified by column chromatography (silica gel, hexane) and recrystallized three times (isopropyl alcohol:hexane=1:1) to obtain 2,7-dibromo-9H-fluorene-9,9-dioctane (F8) (8.30 g, 93%) as a white solid. $^1$H NMR (400 MHz, CDCl3): 7.53-7.43 (m, 6H), 1.92-1.88 (m, 4H), 1.20-1.05 (m, 20H), 0.85 (t, 6H), 0.59 (d, 4H).

<Example 2> Synthesis of Fluorene Monomer F8-pinB Containing Alkyl Chain and Oxabrolane To a one-neck round-bottom flask (250 cm$^3$) was added a F8 (4.00 g, 7.29 mmol), and the inside of the flask was replaced with nitrogen. After adding tetrahydrofuran (THF) (80 cm$^3$) and cooling down to −78° C., a n-butyl lithium solution (13.1 cm$^3$, 32.8 mmol) was slowly added over 30 minutes, and then stirred for 1 hour. 4,4,5,5-tetramethyl-2-(1-methylmethoxy)-1,3,2-dioxaborolate (3.39 g, 18.2 mmol) was added and stirred at room temperature for 18 hours. The reaction mixture extracted with diethyl ether and washed with water and a saturated aqueous sodium chloride solution. Anhydrous MgSO$_4$ was added to the separated organic solution and stirred to remove moisture in the product. After filtration, the concentrated product was recrystallized three times with acetone to obtain 9,9-dioctylfluorene-2,7-diboronic acid bis(pinacol) ester, (F8-pinB) (4.00 g, 82%) as a white solid. $^1$H NMR (400 MHz, CDCl3): δ=7.81-7.67 (m, 6H), 2.00 (m, 4H), 1.37 (s, 24H), 1.2-0.95 (m, 20H), 0.79 (t, 6H), 0.56 (m, 4H).

<Example 3> Synthesis of Fluorene Monomer F6OH Containing Hydroxyl Group

To a two-neck round-bottom flask (250 cm$^3$) were added 2,7-dibromo fluorene (3.00 g, 9.25 mmol), 6-bromo-1-hexanol (4.10 g, 23.1 mmol), and tetrabutyl ammonium bromide (1.65 g, 5.12 mmol). Then, dimethyl sulfoxide (60 cm$^3$) and a 50 wt % of sodium hydroxide solution (30.0 g) were added and stirred for 18 hours under reflux conditions at 120° C. After cooling down to room temperature, the reaction mixture extracted with diethyl ether and washed with water and a saturated aqueous sodium chloride solution. Anhydrous MgSO$_4$ was added to the separated organic solution and stirred to remove moisture in the product. After filtration, the concentrated product was purified by column chromatography (silica gel, ethyl acetate:hexane=2:3) and recrystallized three times [(ethanol:hexane=1:1) two times, toluene one time] to obtain 2,7-dibromo-9H-fluorene-9,9-dioctane (F6OH) (3.61 g, 74%) as a white solid. $^1$H NMR (400 MHz, CDCl3): δ=7.55-7.37 (m, 6H), 3.53 (t, 4H), 1.88-196 (m, 4H), 1.33-1.44 (m, 4H), 1.03-1.20 (m, 8H), 0.50-0.70 (m, 4H).

<Example 4> Synthesis of Monomer DBBT Used for Polymerization of Polyfluorene-Based Polymer Emitting Green Light To a two-neck round-bottom flask (500 cm$^3$) were added 2,1,3-benzothiadiazole (15.0 g, 110 mmol) and an aqueous hydrogen bromide solution (75 cm$^3$), followed by stirring at 135° C. Thereafter, bromine (17 cm$^3$, 330 mmol) was added for 1.5 hours using a dropping funnel, an aqueous hydrogen bromide solution (30 cm$^3$) was added, and then stirred for 3 hours. Then, the reaction mixture was filtered with water, methanol and toluene, and recrystallized two times with 1,2-dichlorobenzene to obtain 4,7-dibromo-2,1,3-benzothiadiazole (DBBT) (18.7 g, 58%) as a yellow needle-shaped solid. $^1$H NMR (400 MHz, CDCl3): δ=7.71 (s, 2H).

<Example 5> Synthesis of TBT for Synthesis of Monomer DBTBT

To a Schlenk tube (100 cm3) were added a DBBT (1.00 g, 3.40 mmol), tetrakis(triphenylphosphine) palladium(0) (0.24 g, 0.21 mmol), 2-tributyl stannyl thiophene (2.80 g, 7.50 mmol), followed by replacing with nitrogen. Toluene (20 cm$^3$) subjected to bubbling with nitrogen gas was added and stirred at 90° C. for 48 hours. After the reaction mixture was cooled down to room temperature, water was added, and the resulting mixture was extracted with dichloromethane, and then washed with water and a saturated aqueous sodium chloride solution. Anhydrous MgSO$_4$ was added to the separated organic solution and stirred to remove moisture in the product. After filtration, the concentrated product was purified by column chromatography (silica gel, dichloromethane:hexane=1:1), and recrystallized with ethanol to obtain 4,7-di-2-thienyl-2,1,3-benzothiadiazole (TBT) (0.7 g, 87%) as a red solid. $^1$H NMR (400 MHz, CDCl3): δ=8.10 (dd, 2H), 7.87 (s, 2H), 7.44 (dd, 2H), 7.20 (dd, 2H).

<Example 6> Synthesis of Monomer DBTBT Used for Polymerization of Polyfluorene-Based Polymer Emitting Red Light To a one-neck round-bottom flask (250 cm$^3$) was added a TBT (0.96 g, 3.20 mmol), chloroform (40 cm$^3$) was added to dissolve all of the products, and then N-bromosuccinimide (1.71 g, 9.59 mmol) was added thereto. The mixed reaction product was stirred at room temperature for 18 hours and filtered with chloroform. The resulting reaction product was recrystallized once with dimethylformamide and chloroform, respectively, to obtain 4,7-bis(5-bromo-2- thienyl)-2,1,3-benzothiadiazole (DBTBT) (0.97 g, 66%) as a red needle-shaped solid. $^1$H NMR (400 MHz, CDCl3): δ=7.81 (d, 2H), 7.79 (s, 2H), 7.16 (d, 2H).

[Polymer Containing Hydroxyl Group and Emitting Light of Three Colors]

A P(F6OH—F8-TBT) emitting red light, a P(F6OH—F8-BT) emitting green light, and a P(F6OH—F8) emitting blue light, were synthesized through palladiumcatalyzed Suzuki coupling using the monomers synthesized in Examples 1 to 6. In addition, each monomer was synthesized by setting the ratio to 1:3 (F6OH:ther monomers).

$cm^3$) was added and stirred at 90° C. for 18 hours. Phenyl boronic acid (0.0949 g, 0.778 mmol) was dissolved in toluene (3 $cm^3$) and added, followed by stirring at 90° C. for 2 hours. Bromo benzene (0.2443 g, 1.556 mmol) was added and stirred at 90° C. for 18 hours. Methanol was added dropwise to the reaction mixture, resulting in precipitation, which was filtered with excess water and methanol. The precipitate was subjected to a Soxhlet process for 48 hours or more using acetone to remove a low molecular weight polymer and dried to obtain a polymer, [poly(dihexanol

[Formula 3]

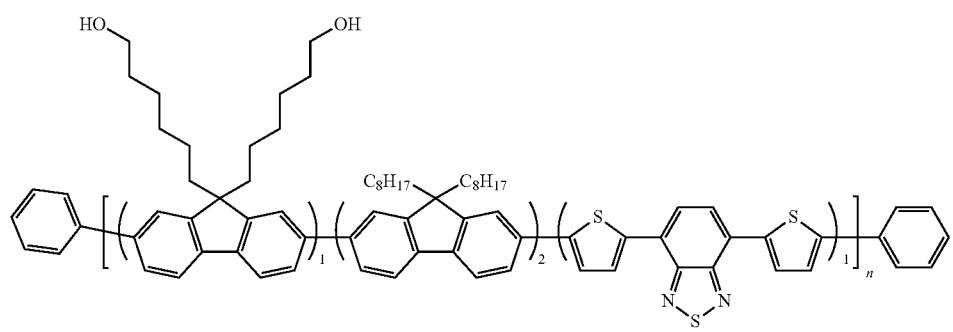

P(F6OH-F8-TBT)

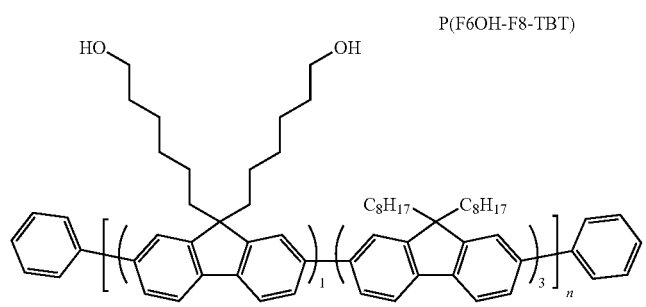

P(F6OH-F8)

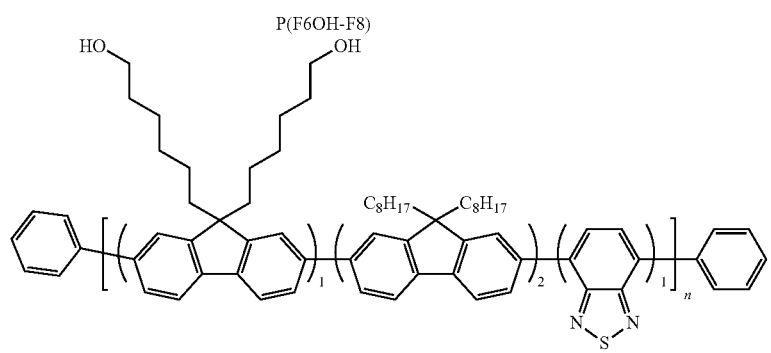

P(F6OH-F8-BT)

<Example 7> Synthesis of Polyfluorene-Based Polymer P(F6OH—F8-TBT) Containing Hydroxyl Group and Emitting Red Light To a Schlenk flask (250 $cm^3$) were added a DBTBT (0.1738 g, 0.389 mmol), a F8-pinB (0.5000 g, 0.778 mmol), a F6OH (0.2040 g, 0.389 mmol), tetrakis(triphenylphosphine) palladium(0) (0.009 g, 0.008 mmol), and tetra-butyl ammonium bromide (0.0251 g, 0.078 mmol), followed by replacing with nitrogen. Toluene (9 $cm^3$) subjected to bubbling with nitrogen gas was added and stirred at 90° C. for 20 minutes. A 2M aqueous sodium carbonate solution (5 fluorene-dioctyl fluorene-(thiophene-benzothiadiazole-thiophene)] [P(F6OH—F8-TBT)] (0.4700 g, 53%) as a red solid.

<Example 8> Synthesis of Polyfluorene-Based Polymer P(F6OH—F8-BT) Containing Hydroxyl Group and Emitting Green Light To a Schlenk flask (250 $cm^3$) were added a DBBT (0.4575 g, 1.556 mmol), a F8-pinB (2.000 g, 3.113 mmol), a F6OH (0.8160 g, 1.556 mmol), tetrakis(triphenylphosphine) palladium(0) (0.0360 g, 0.031 mmol), tetra-butyl ammonium bromide (0.1003 g, 0.311 mmol), followed by replacing with nitrogen. Toluene (32 cm³) subjected to bubbling with nitrogen gas was added and stirred at 90° C. for 20 minutes. A 2M aqueous sodium carbonate solution (20 cm³) was added and stirred at 90° C. for 6 hours. Phenyl boronic acid (0.3795 g, 3.113 mmol) was dissolved in toluene (5 cm³) and added, followed by stirring at 90° C. for 2 hours. Bromo benzene (0.9774 g, 6.225 mmol) was added and stirred at 90° C. for 12 hours. Methanol was added dropwise to the reaction mixture, resulting in precipitation, which was filtered with excess water and methanol. The precipitate was subjected to a Soxhlet process for 48 hours or more using acetone to remove a low molecular weight polymer and dried to obtain a polymer, poly(dihexanol fluorene-dioctyl fluorene-benzothiadiazole) [P(F6OH—F8-BT)] (1.800 g, 55%) as a yellow thread-shape.

<Example 9> Synthesis of Polyfluorene-Based Polymer P(F6OH—F8) Containing Hydroxyl Group and Emitting Blue Light To a Schlenk flask (250 cm³) were added a F8 (1.067 g, 1.945 mmol), a F8-pinB (2.500 g, 3.891 mmol), a F6OH (1.0200 g, 1.945 mmol), tetrakis(triphenylphosphine) palladium(0) (0.045 g, 0.039 mmol), tetra-butyl ammonium bromide (0.125 g, 0.389 mmol), followed by replacing with nitrogen. Toluene (40 cm³) subjected to bubbling with nitrogen gas was added and stirred at 90° C. for 20 minutes. A 2M aqueous sodium carbonate solution (25 cm³) was added and stirred at 90° C. for 8 hours. Phenyl boronic acid (0.4744 g, 3.891 mmol) was dissolved in toluene (5 cm³) and added, followed by stirring at 90° C. for 2 hours. Bromo benzene (1.222 g, 7.782 mmol) was added and stirred at 90° C. for 12 hours. Methanol was added dropwise to the reaction mixture, resulting in precipitation, which was filtered with excess water and methanol. The precipitate was subjected to a Soxhlet process for 48 hours or more using acetone, and the low molecular weight polymer was removed and dried to obtain a polymer, poly(dihexanol fluorene-dioctyl fluorene) [P(F6OH—F8)] (2.400 g, 52%) as a green thread-shape.

Figure 14:
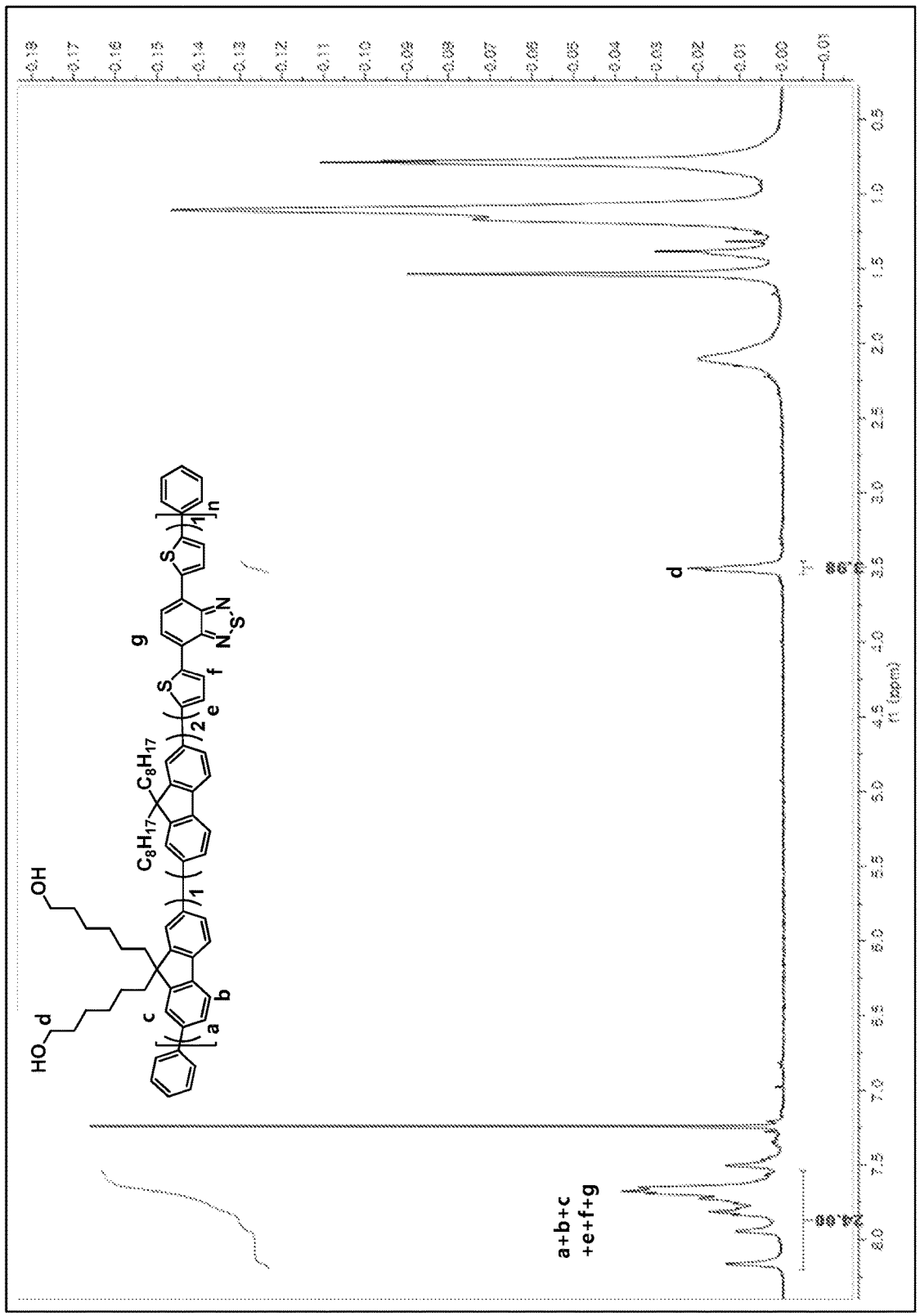
FIG. 14 is a diagram illustrating an NMR graph of P(F6OH—F8-TBT) synthesized according to Example 7.
Figure 15:
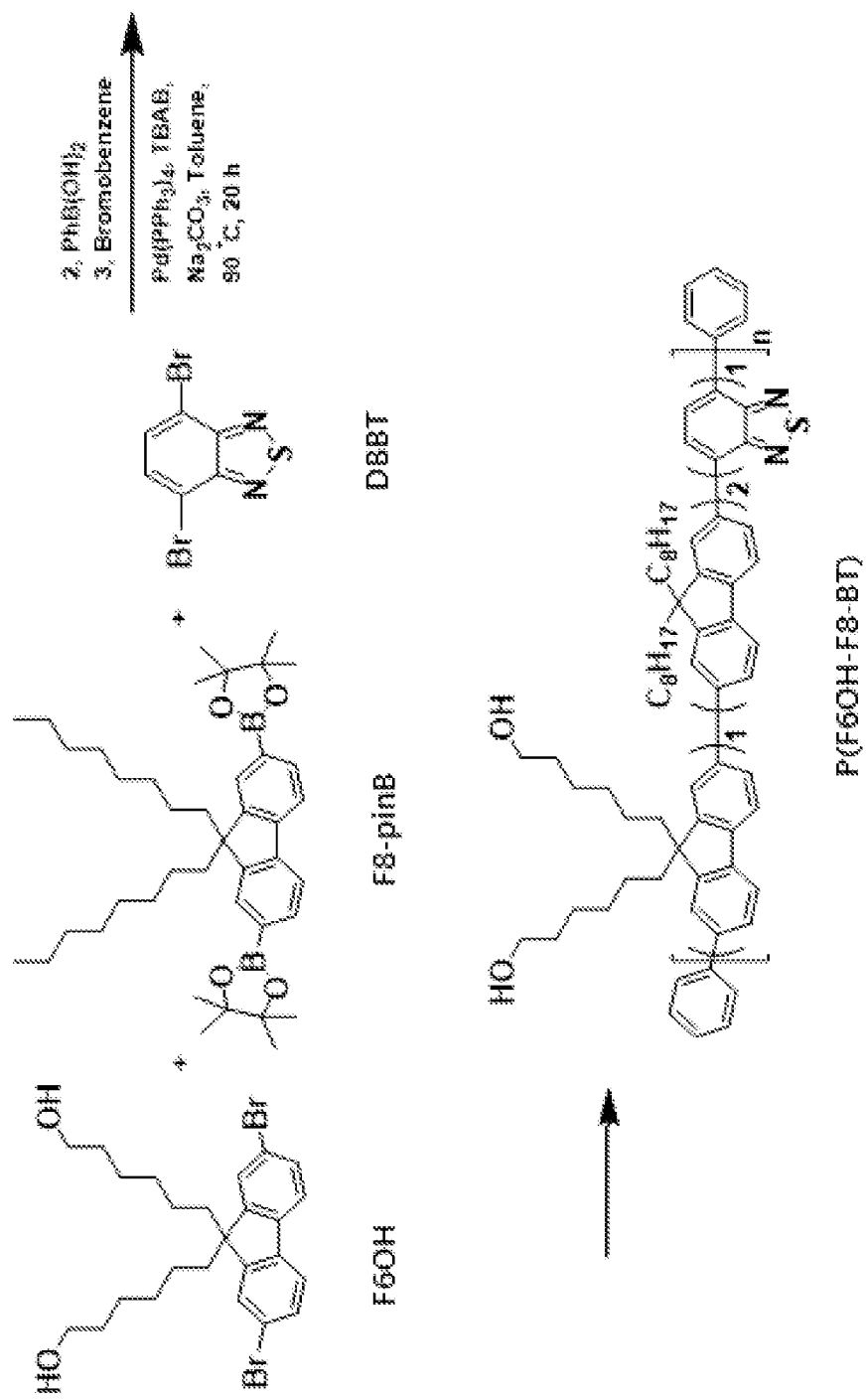
FIG. 15 is a diagram showing a synthesis reaction scheme of a polyfluorene-based polymer [poly(dihexanolfluorene-dioctyl fluorene-benzothiadiazole), P(F6OH—F8-BT) that contains a hydroxy group and emits green light.
Figure 16:
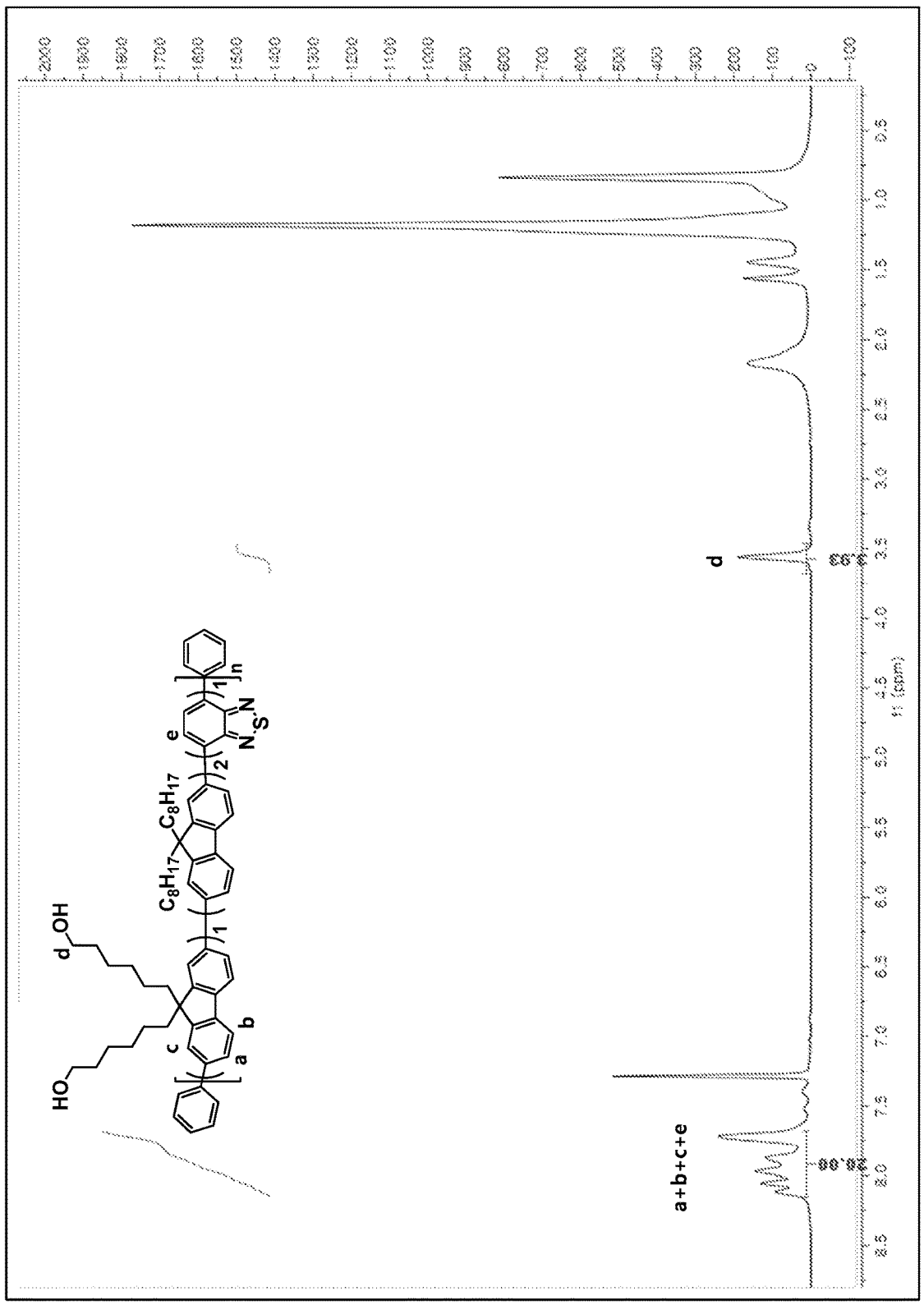
FIG. 16 is a diagram illustrating an NMR graph of P(F6OH—F8-BT) synthesized according to Example 8.
Figure 17:
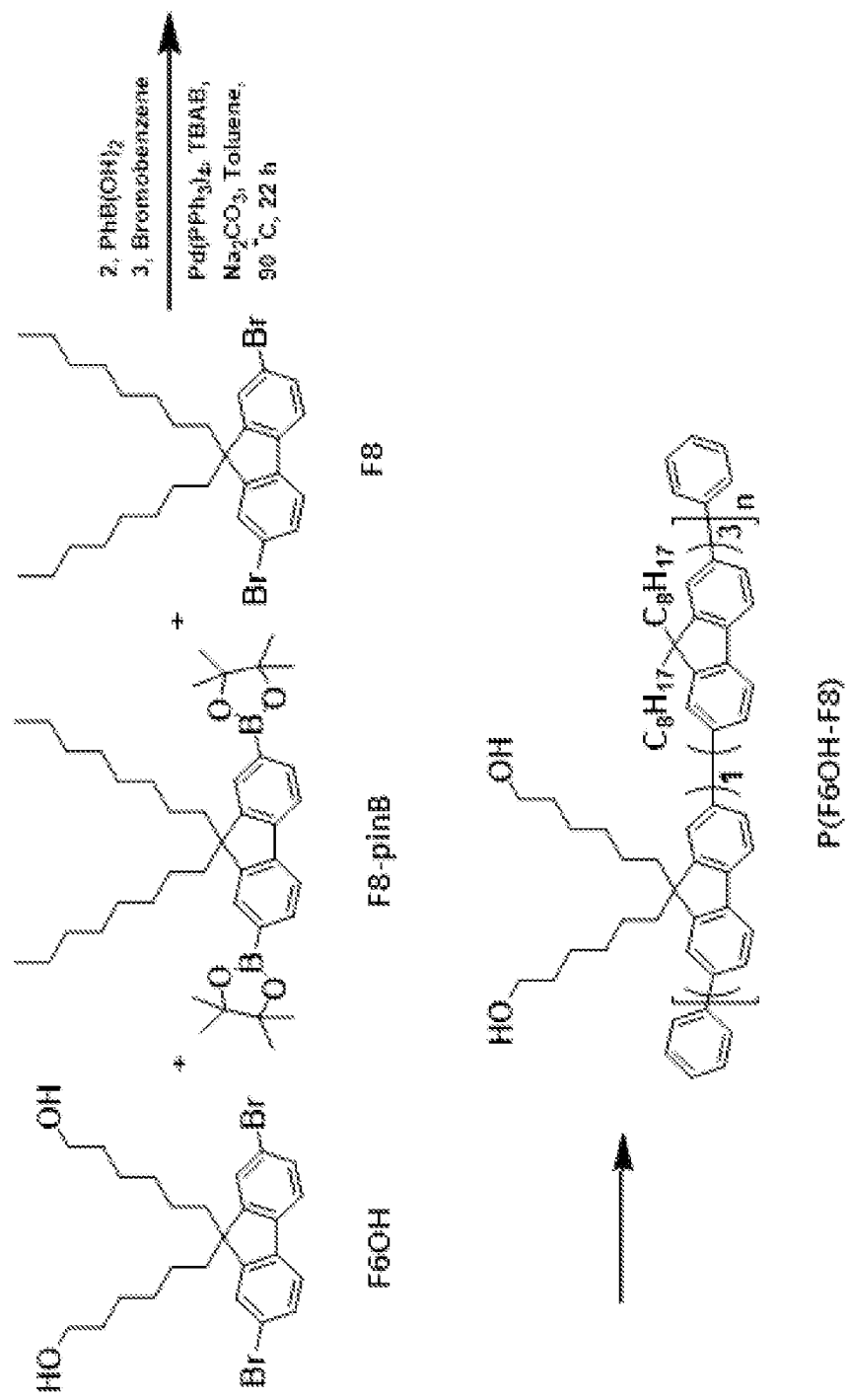
FIG. 17 is a diagram illustrating a synthesis reaction scheme of a polyfluorene-based polymer [poly(dihexanol fluorene-dioctyl fluorene), P(F6OH—F8)] that contains a hydroxy group and emits blue light.
Figure 18:
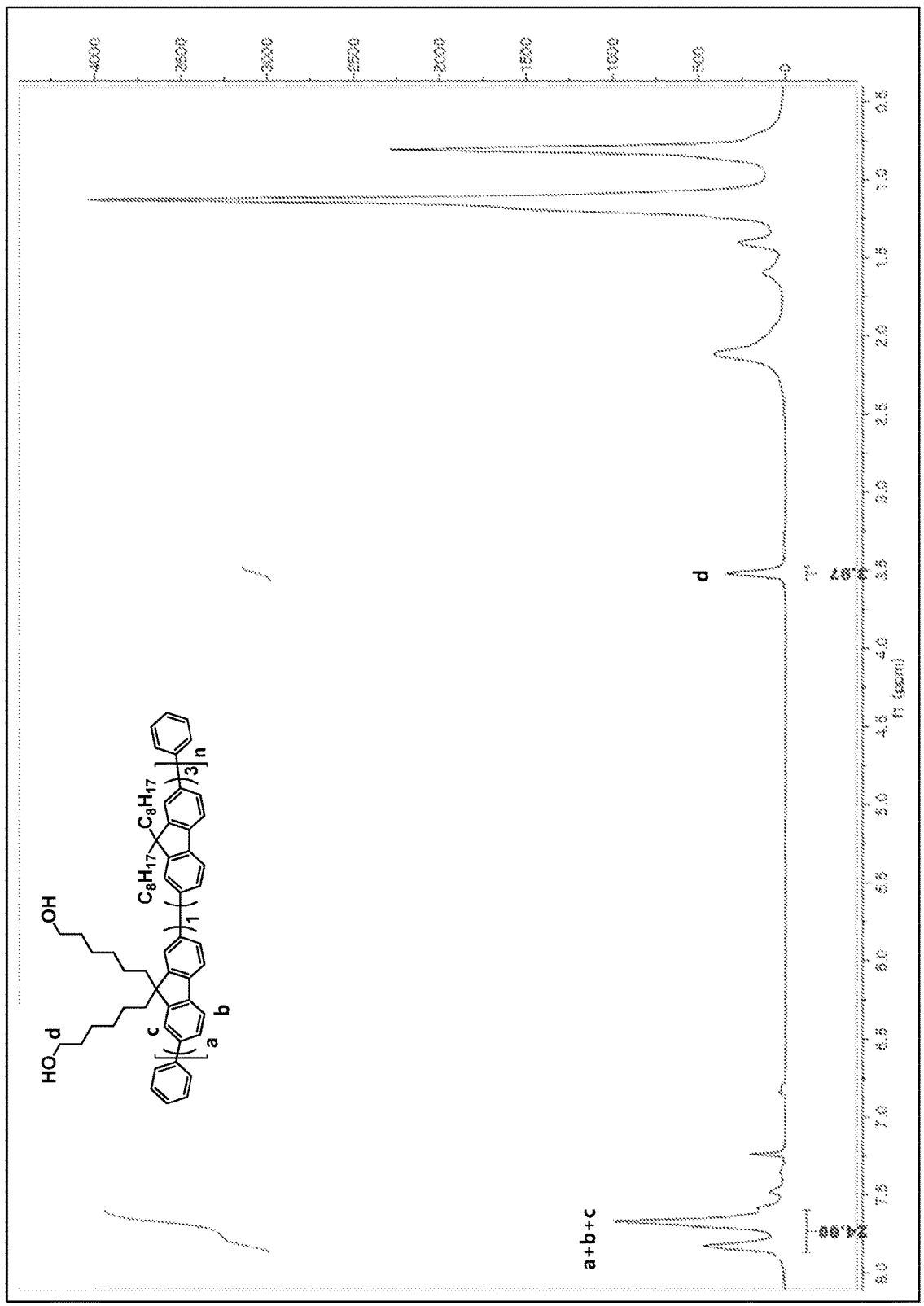
FIG. 18 is a diagram illustrating an NMR graph of P(F6OH—F8) synthesized according to Example 9.
Figure 19:
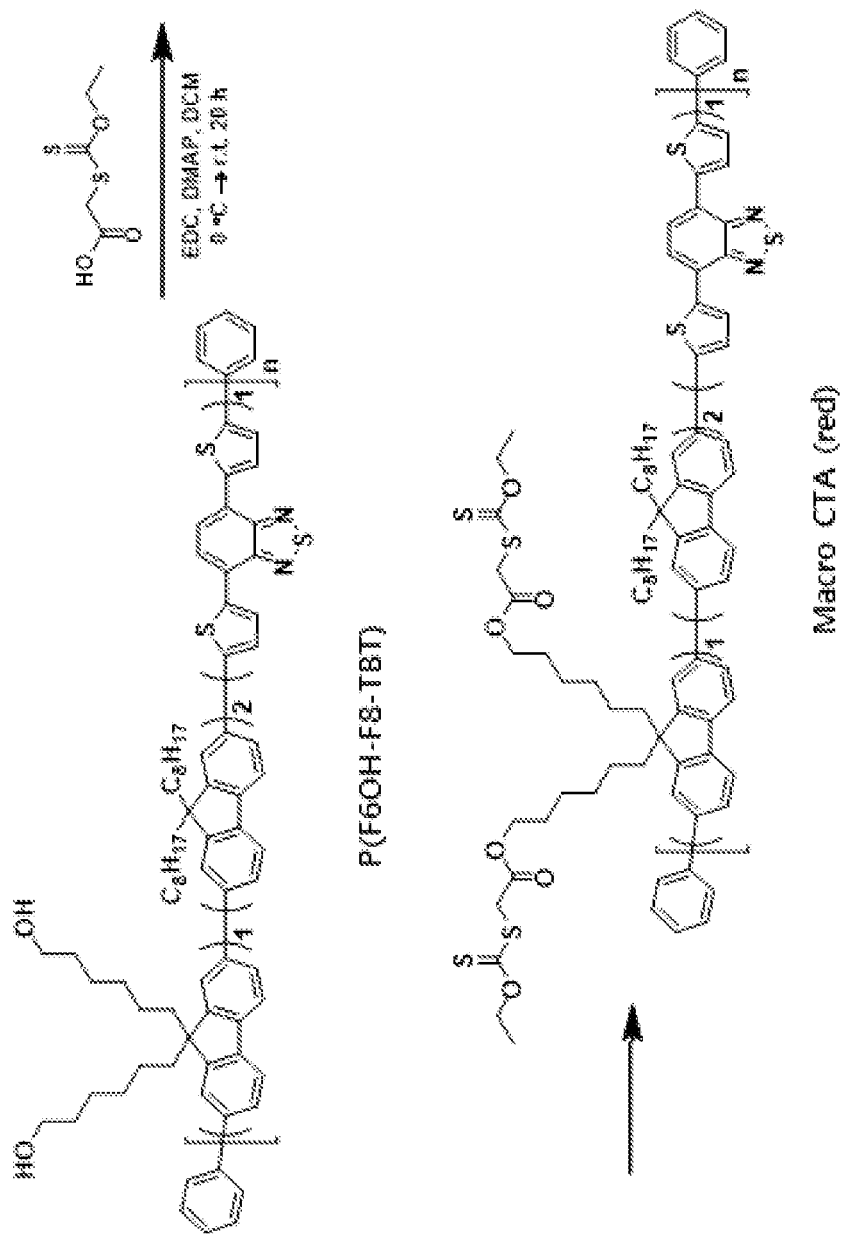
FIG. 19 is a diagram illustrating a synthesis reaction scheme of a macro chain transfer agent [polydihexyl xanthate fluorene-dioctyl fluorene-(thiophenebenzothiadiazole-thiophene), Macro CTA (red)] that contains a xanthate group and emits red light.

It was confirmed from FIGS. 14, 16 and 18 that the ratio of monomers in polymers synthesized in Examples 7 to 9 was analyzed by NMR, and a P(F6OH—F8) was synthesized at a ratio of 1:3 (F6OH:other monomers) as initially intended, by comparing certain peaks of aromatics at 7.25 ppm or more with a certain peak next to a hydroxy group at 3.5 ppm.

[Three Types of Macro CTAs]

Ethyl xanthogenacetic acid was added to the three polymers synthesized in Examples 7 to 9 through Steglich esterification using N,N'-dicylohexyl carbodiimide (DCC) or 1-ethyl-3-(3-dimethylaminopropyl)carbodiimide (EDC). Steglich esterification reaction using DCC or EDC produced impurities in the form of urea as by-products, so impurities were removed and purified through a Soxhlet process for 48 hours or more.

[Formula 4]

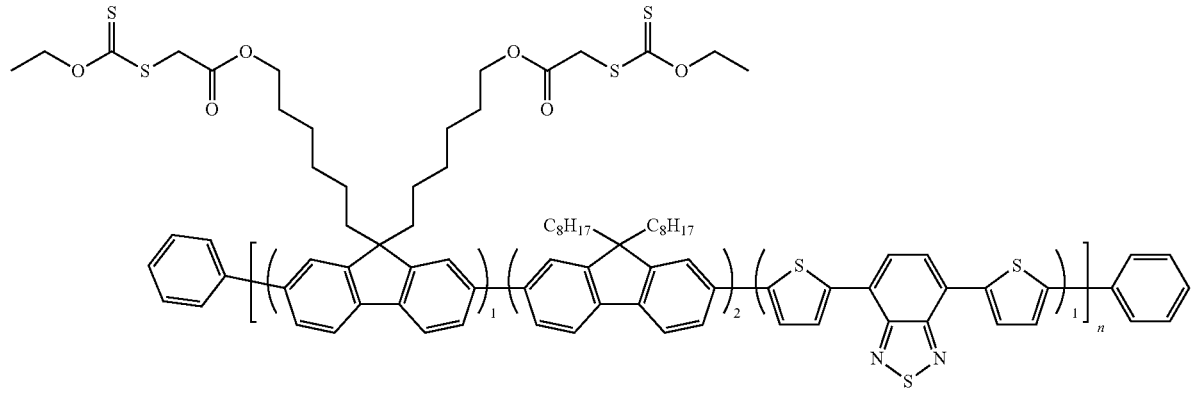

Macro CTA (red)

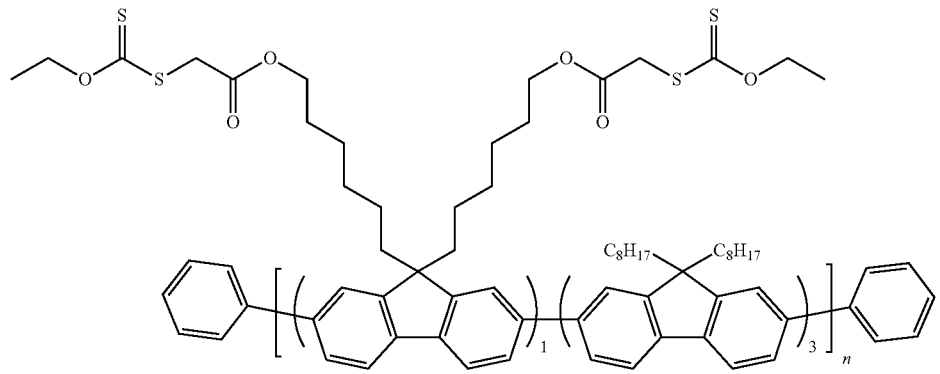

Macro CTA (blue)

-continued

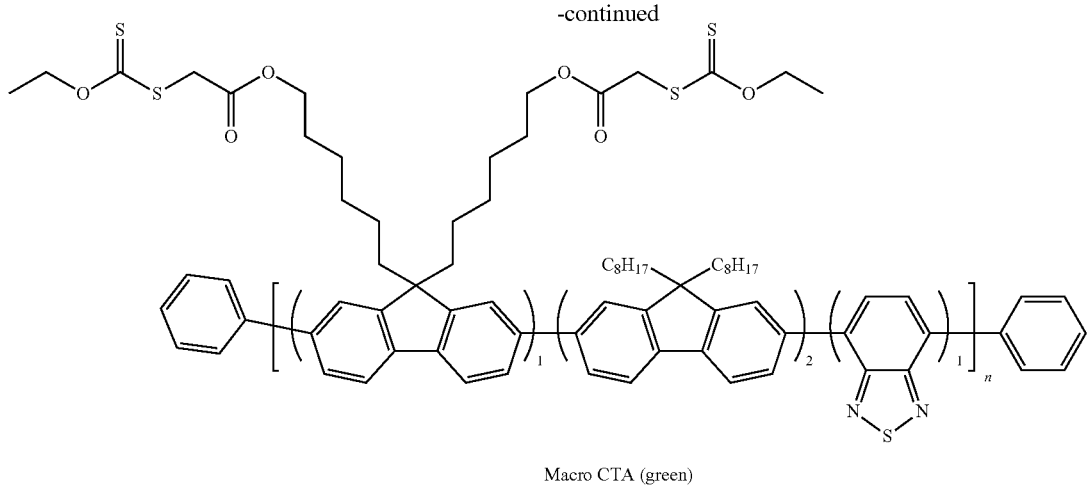

Macro CTA (green)

<Example 10> Synthesis of Macro Chain Transfer Agent [Macro CTA (Red)] Containing Xanthate Group and Emitting Red Light To a three-neck round-bottom flask (500 cm³) were added a P(F6OH—F8-TBT) (0.47 g) and ethyl xanthogenacetic acid (0.225 g, 1.248 mmol), and dichloromethane (90 cm³) was added to dissolve all of the products, and then cooled down to 0° C. Thereafter, 1-ethyl-3-(3-dimethylaminopropyl) carbodiimide (0.194 g, 1.248 mmol) and 4-dimethylaminopyridine (0.0762 g, 0.624 mmol) were added and stirred at room temperature for 20 hours. The reaction mixture was extracted with dichloromethane and washed with water and a saturated aqueous sodium chloride solution. Anhydrous MgSO₄ was added to the separated organic solution and stirred to remove moisture in the product. The reaction mixture was filtered, concentrated, and methanol was added dropwise to the mixture, resulting in precipitation. The precipitate was subjected to a Soxhlet process for 48 hours or more using methanol to remove impurities and dried to obtain a polymer, poly[dihexyl xanthate fluorene-dioctyl fluorene-(thiophenebenzothiadiazole-thiophene)] [Macro CTA (red)] (0.27 g) as a red solid.

<Example 11> Synthesis of Macro Chain Transfer Agent [Macro CTA (Green)] Containing Xanthate Group and Emitting Green Light To a three-neck round-bottom flask (500 cm³) were added a P(F6OH—F8-BT) (1.60 g) and ethyl xanthogenacetic acid (0.91 g, 5.04 mmol), and dichloromethane (150 cm³) was added to dissolve all of the products, and then cooled down to 0° C. Thereafter, 1-ethyl-3-(3-dimethylaminopropyl) carbodiimide (0.78 g, 5.04 mmol) and 4-dimethylaminopyridine (0.31 g, 2.52 mmol) were added and stirred at room temperature for 18 hours. The reaction mixture was extracted with dichloromethane and washed with water and a saturated aqueous sodium chloride solution. Anhydrous MgSO₄ was added to the separated organic solution and stirred to remove moisture in the product. The reaction mixture was filtered, concentrated, and methanol was added dropwise to the mixture, resulting in precipitation. The precipitate was subjected to a Soxhlet process for 48 hours or more using methanol to remove impurities and dried to obtain a polymer poly(dihexyl xanthate fluorene-dioctyl fluorenebenzothiadiazole) [Macro CTA (green)] (1.83 g) as a yellow thread-shape.

<Example 12> Synthesis Macro Chain Transfer Agent [Macro CTA (Blue)] Containing Xanthate Group and Emitting Blue Light To a three-neck round-bottom flask (250 cm³) were added 4-dimethylaminopyridine (0.31 g, 2.52 mmol) and ethyl xanthogenacetic acid (0.86 g, 4.74 mmol), and a solvent (dichloromethane:tetrahydrofuran=1:1) (50 cm³) was added, cooled down to 0° C., and stirred. After 5 minutes, N,N'-dicyclohexylacrbodiimide (0.98 g, 4.74 mmol) was added and stirred at 0° C. for 1 hour. A P(F6 OH—F8) (2.20 g) was all dissolved in a solvent (dichloromethane:tetrahydrofuran=1:1) (50 cm³) and added thereto. Thereafter, the reaction mixture was stirred at 30° C. for 18 hours. The reaction mixture was extracted with dichloromethane and washed with water and a saturated aqueous sodium chloride solution. Anhydrous MgSO₄ was added to the separated organic solution and stirred to remove moisture in the product. The reaction mixture was filtered, concentrated, and methanol was added dropwise to the mixture, resulting in precipitation. The precipitate was subjected to a Soxhlet process for 48 hours or more using methanol to remove impurities and dried to obtain a polymer poly(dihexyl xanthate fluorene-dioctyl fluorene) [Macro CTA (blue)] (2.30 g) as a yellow thread-shape.

Figure 20:
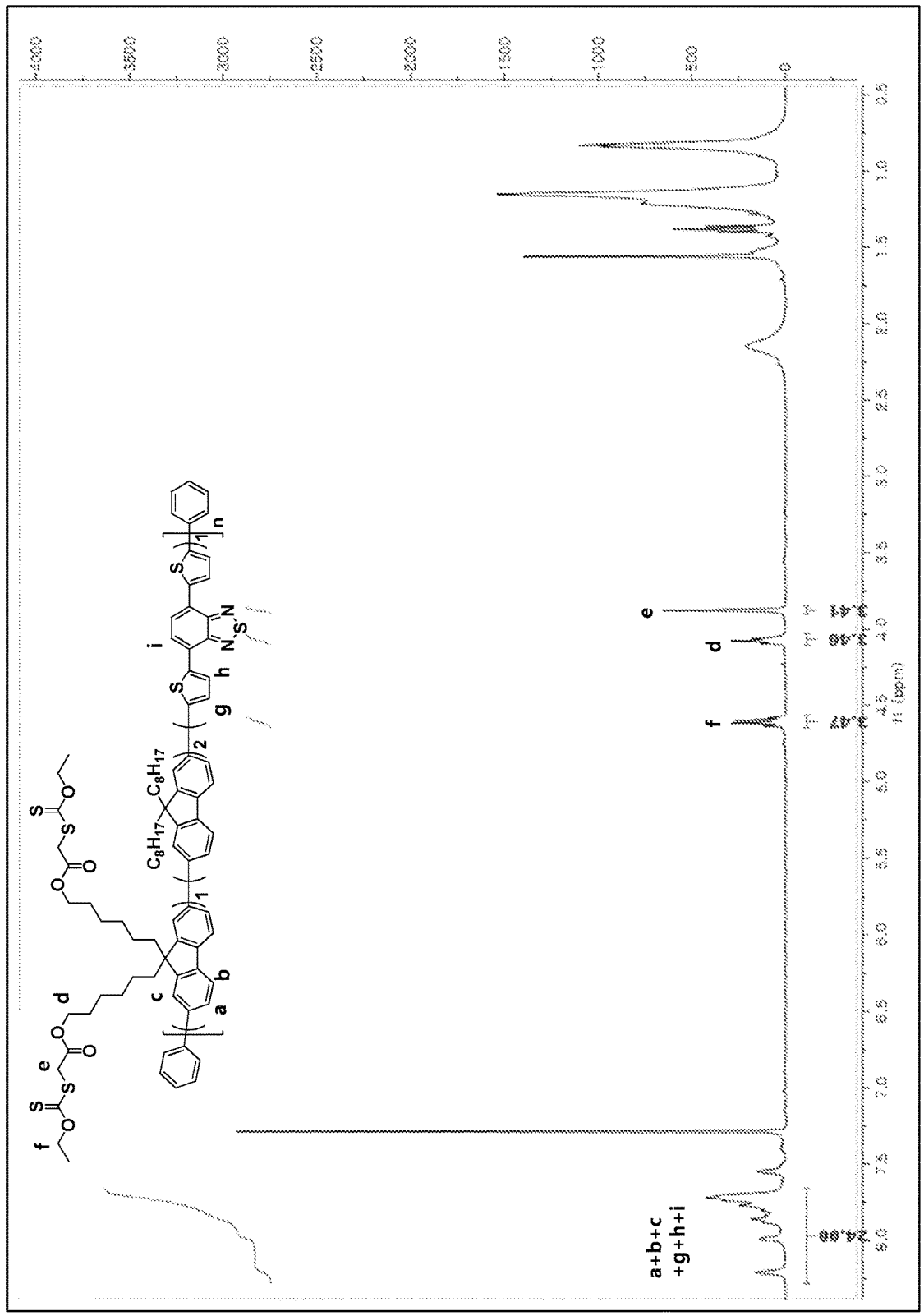
FIG. 20 is a diagram illustrating an NMR graph of a Macro CTA (red) synthesized according to Example 10.
Figure 21:
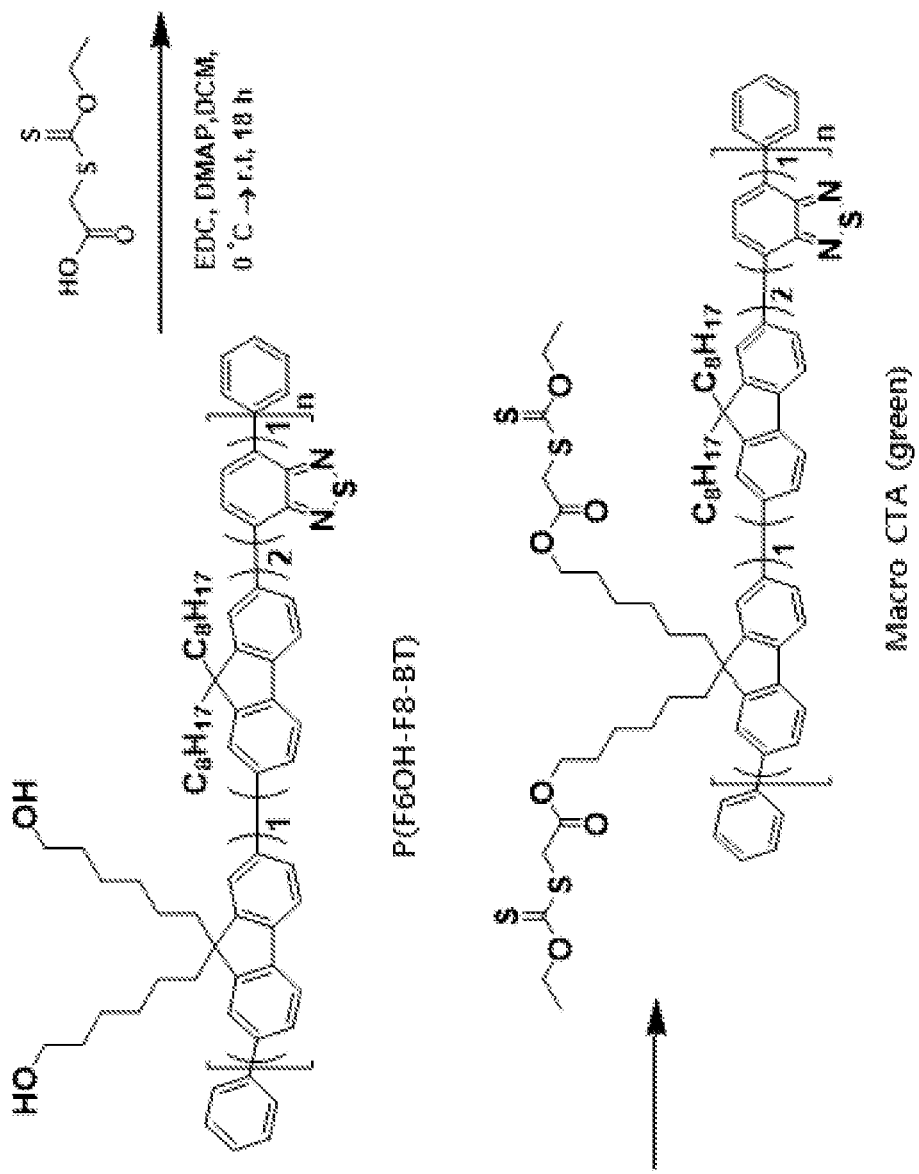
FIG. 21 is a diagram illustrating a synthesis reaction scheme of a macro chain transfer agent [poly(dihexyl xanthate fluorene-dioctyl fluorenebenzothiadiazole), Macro CTA (green)] that contains the xanthate group and emits green light.
Figure 22:
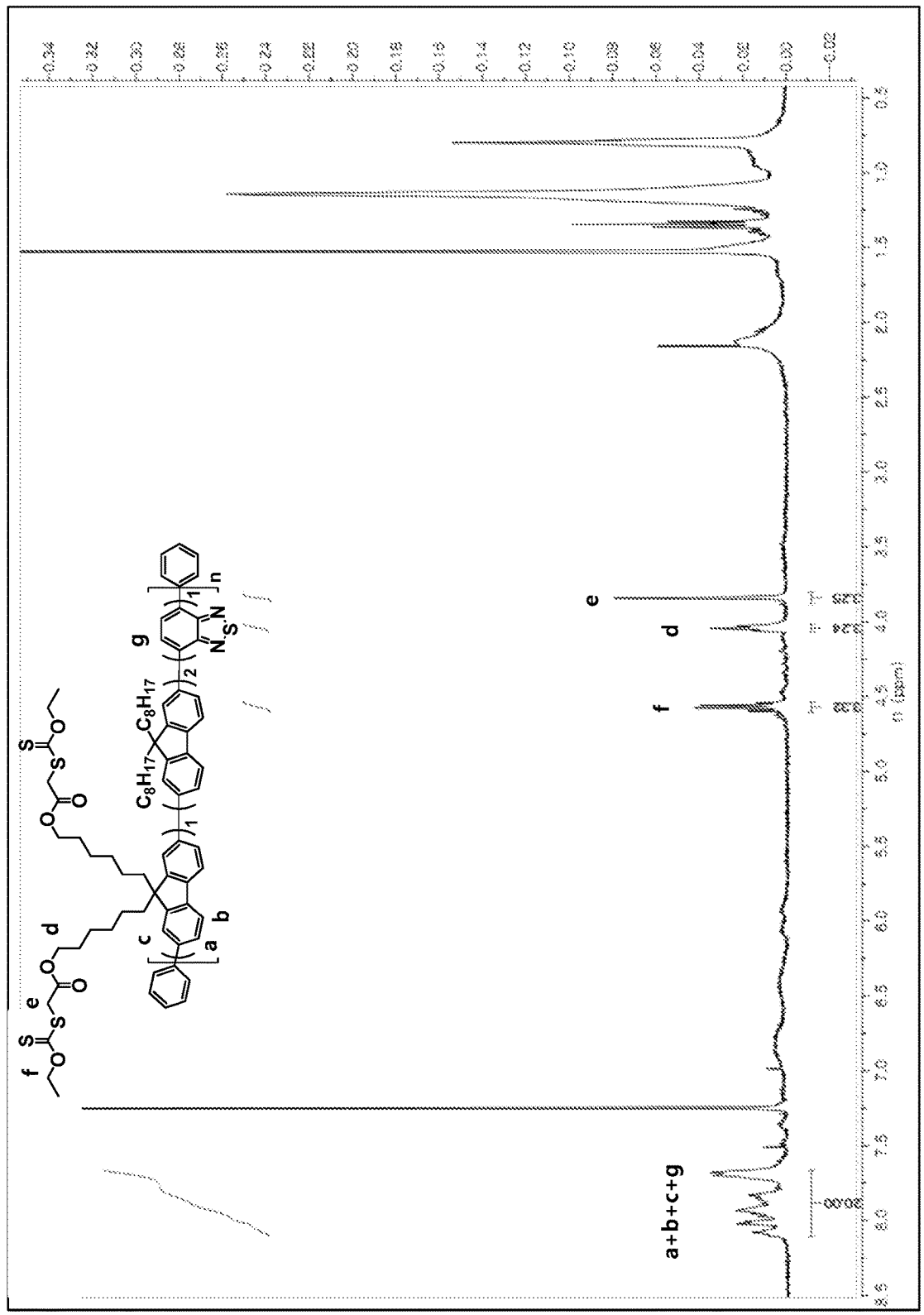
FIG. 22 is a diagram illustrating an NMR graph of a Macro CTA (green) synthesized according to Example 11.
Figure 23:
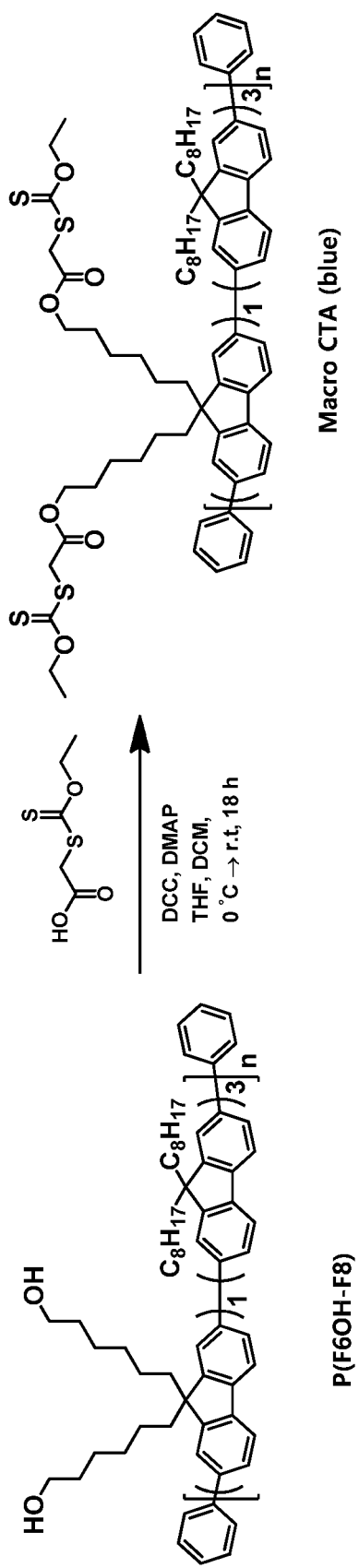
FIG. 23 is a diagram illustrating a synthesis reaction scheme of a macro chain transfer agent [poly(dihexyl xanthate fluorene-dioctyl fluorene), Macro CTA (blue)] that contains the xanthate group and emits blue light.
Figure 24:
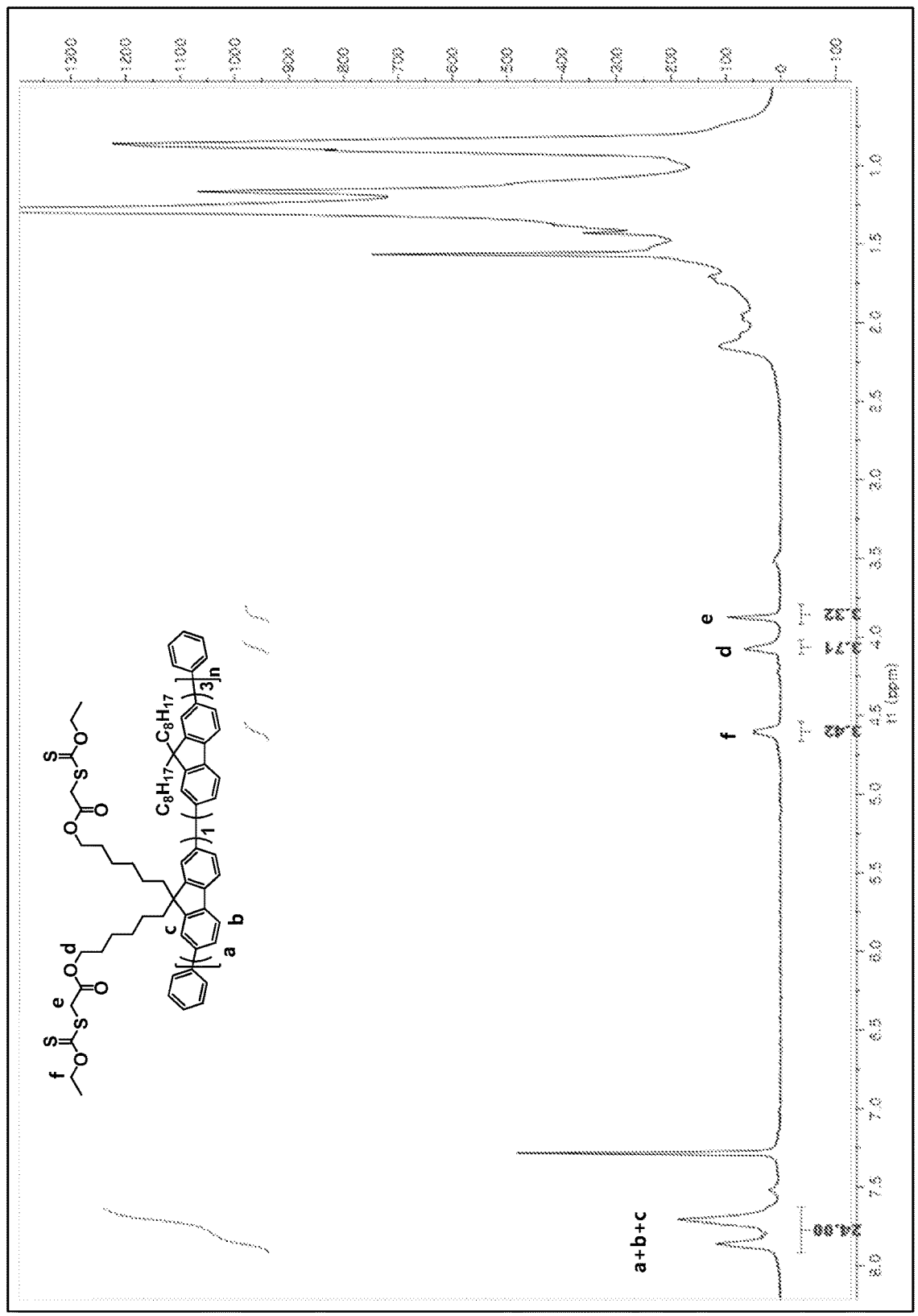
FIG. 24 is a diagram illustrating an NMR graph of a Macro CTA (blue) synthesized according to Example 12.
Figure 25:
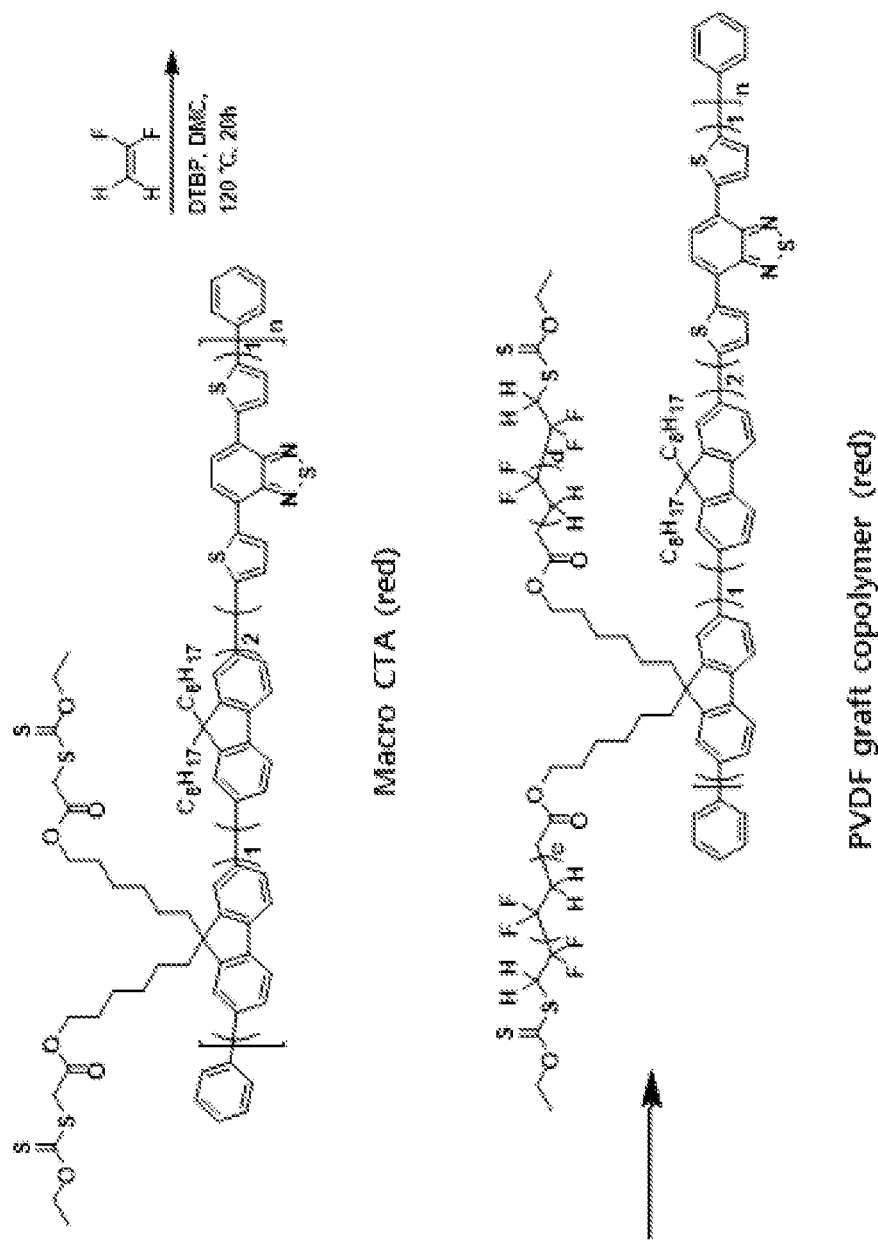
FIG. 25 is a diagram illustrating a synthesis reaction scheme of a polyfluorene-based polymer-PVDF graft copolymer [polydihexyl xanthate fluorene-dioctyl fluorene-(thiophenebenzothiadiazole-thiophene)-g-PVDF, PVDF graft copolymer (red)] emitting red light.
Figure 26:
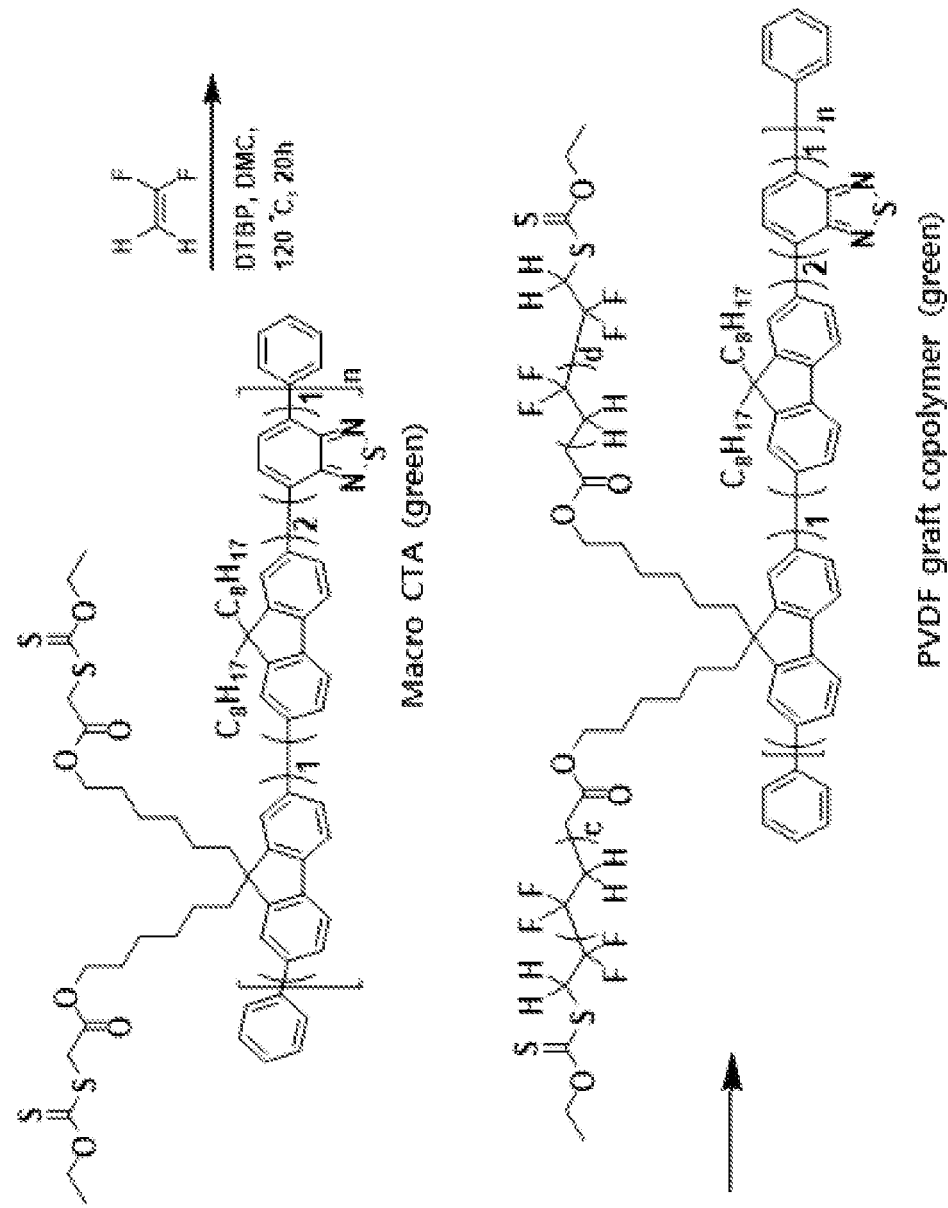
FIG. 26 is a diagram illustrating a synthesis reaction scheme of a polyfluorene-based polymer-PVDF graft copolymer [poly(dihexyl xanthate fluorene-dioctyl fluorenebenzothiadiazole)-g-PVDF, PVDF graft copolymer (green)] emitting red light.

It was confirmed from FIGS. 20, 22 and 24 that in the three types of macro CTAs prepared in Examples 10 to 12, certain peaks of hydrogen and carbon next to a hydroxy group were removed and the peak of the xanthate group was newly generated by NMR analysis, thereby confirming that the reaction proceeded smoothly.

[Three Types of PVDF Graft Copolymers]

Among the three types of polymers prepared in Examples 10 to 12, RAFT polymerization of a PVDF was carried out in a high-pressure reactor using a Macro CTA (blue) and a Macro CTA (green). Since a VDF, which is a monomer of the PVDF, produced an electron-deficient radical when radical reaction proceeded, it is appropriate to generate an electron-rich radical as a suitable initiator. Thus, di-tert-butyl peroxide (DTBP), which can provide an electron-rich, tert-butyl radical, was used as an initiator, and the reaction was carried out at 120° C., which is an appropriate initiation temperature for DTBP. It was confirmed that in the case of the Macro CTA (blue), the solubility in di-methyl carbonate (DMC), which a solvent used in the reaction, was poor, but the reaction proceeded by dissolving in small portions in a high temperature/high pressure reactor. Under the conditions (120° C./300 rpm) in the high-pressure reactor, the pressure decreased by 2 bar from the beginning of the reaction to the end of the reaction. The synthesized polymer was subjected to a Soxhlet process for 24 hours or more using chloroform in order to remove an unreacted Macro CTA, the material from which the Macro CTA was removed was dissolved in cyclohexanone, and then an undissolved PVDF homopolymer was removed by a centrifuge.

<Example 13> Synthesis of Polyfluorene-Based Polymer and PVDF Graft Copolymer [PDF Graft Copolymer (Red)] Emitting Red Light To a high-pressure reaction vessel (1,000 cm$^3$) were added a Macro CTA (red) (1.50 g) and dimethyl carbonate (300 cm$^3$), and then di-tert butyl peroxide (0.04 g, 0.26 mmol) was mixed with dimethyl carbonate (20 cm$^3$) and added thereto. Then, after coupling the high-pressure reaction vessel to the high-pressure reactor, oxygen is removed from the solution by purging with argon gas. Subsequently, vinylidene fluoride (30.0 g) was added and stirred at 120° C. and at 300 rpm for 20 hours. It was confirmed that pressure

[Formula 1-4]

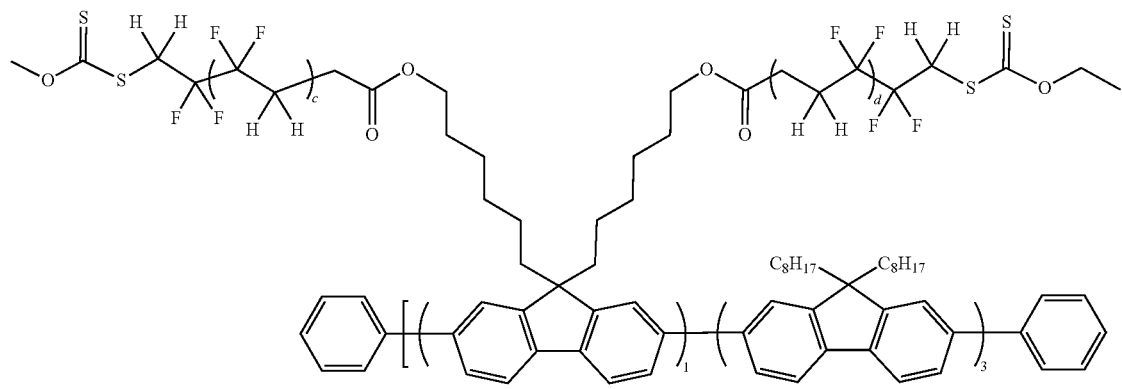

[Formula 1-5]

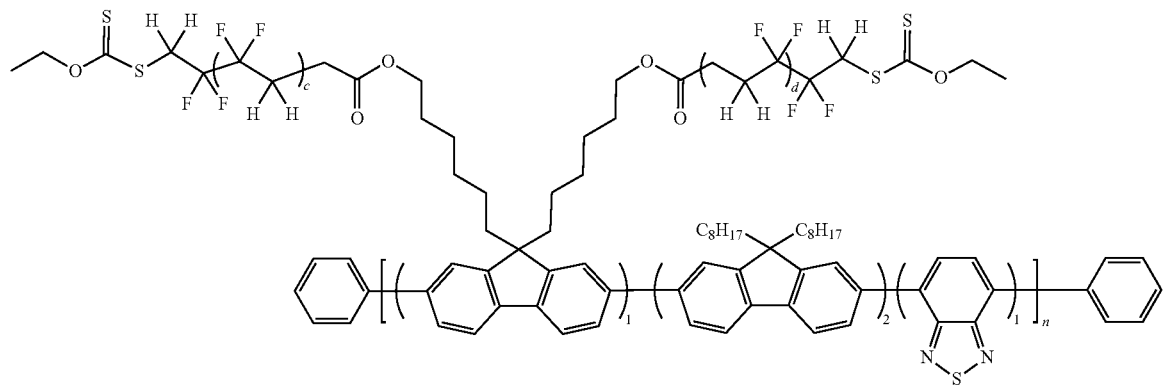

[Formula 1-6]

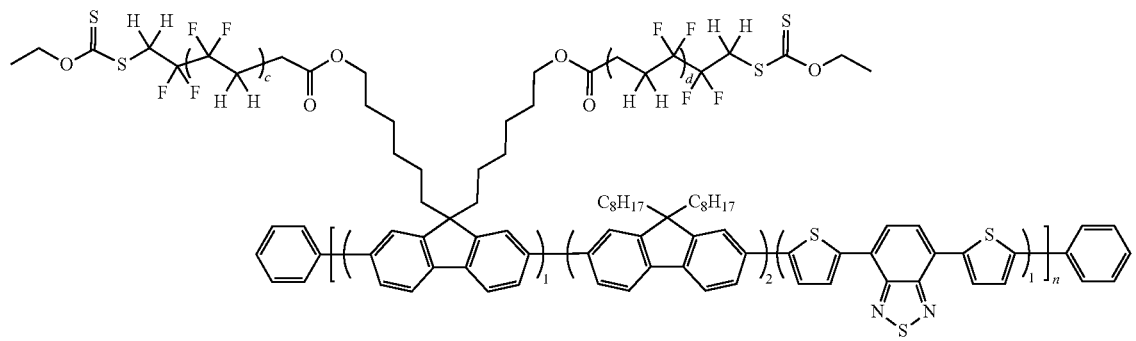

was initially 15.3 bar and decreased to 13.5 bar after 20 hours. The reaction mixture was cooled down to room temperature and residual vinylidene fluoride gas was removed. The reaction mixture was concentrated and added dropwise to methanol, resulting in precipitation. The precipitate was subjected to a Soxhlet process for 24 hours or more using chloroform to remove an unreacted Macro CTA (red), dissolved in an excess of cyclohexanone, and removed an undissolved PVDF homopolymer by using a centrifuge. A cyclohexanone solution in which the reactant was dissolved was concentrated and methanol was added dropwise to the solution, resulting in precipitation. The precipitate was filtered and dried to obtain poly [dihexyl xanthate fluorene-dioctyl fluorene-(thiophene-benzothiadiazole-thiophene)]-g-PVDF [PVDF graft copolymer (red)] (3.50 g).

<Example 14> Synthesis of Polyfluorene-Based Polymer-PVDF Graft Polymer [PDF Graft Copolymer (Green)] Emitting Green Light To a high-pressure reaction vessel (1,000 cm$^3$) were added a Macro CTA (green) (1.63 g) and dimethyl carbonate (300 cm$^3$), and then di-tert butyl peroxide (0.04 g, 0.26 mmol) was mixed with dimethyl carbonate (20 cm$^3$) and added thereto. Then, after coupling the high-pressure reaction vessel to the high-pressure reactor, oxygen is removed from the solution by purging with argon gas. Subsequently, vinylidene fluoride (30.0 g) was added and stirred at 120° C. and at 300 rpm for 20 hours. It was confirmed that pressure was initially 15.3 bar and decreased to 13.5 bar after 20 hours. The reaction mixture was cooled down to room temperature and residual vinylidene fluoride gas was removed. The reaction mixture was concentrated and added dropwise to methanol, resulting in precipitation. The precipitate was subjected to a Soxhlet process for 24 hours or more using chloroform to remove an unreacted Macro CTA (green), dissolved in an excess of cyclohexanone, and removed an undissolved PVDF homopolymer by using a centrifuge. A cyclohexanone solution in which the reactant was dissolved was concentrated and methanol was added dropwise to the solution, resulting in precipitation. The precipitate was filtered and dried to obtain a poly(dihexyl xanthate fluorene-dioctyl fluorene-benzothiadiazole)-g-PVDF [PVDF graft copolymer (green)] (4.10 g).

<Example 15> Synthesis of Polyfluorene-Based Polymer-PVDF Graft Copolymer [PDF Graft Copolymer (Blue)] Emitting Blue Light To a high-pressure reaction vessel (1,000 cm$^3$) were added a Macro CTA (blue) (2.43 g) and dimethyl carbonate (400 cm$^3$), and then di-tert butyl peroxide (0.04 g, 0.26 mmol) was mixed with dimethyl carbonate (20 cm$^3$) and added thereto. Then, after coupling the high-pressure reaction vessel to the high-pressure reactor, oxygen is removed from the solution by purging with argon gas. Subsequently, vinylidene fluoride (35.0 g) was added and stirred at 120° C. and at 300 rpm for 20 hours. It was confirmed that pressure was initially 16.0 bar and decreased to 14.0 bar after 20 hours. The reaction mixture was cooled down to room temperature and residual vinylidene fluoride gas was removed. The reaction mixture was concentrated and added dropwise to methanol, resulting in a precipitate. The precipitate was subjected to a Soxhlet process for 24 hours or more using chloroform to remove unreacted Macro CTA (blue), dissolved in an excess of cyclohexanone, and removed an undissolved PVDF homopolymer by using a centrifuge. A cyclohexanone solution in which the reactant was dissolved was concentrated and methanol was added dropwise to the solution, resulting in a precipitate. The precipitate was filtered and dried to obtain a poly(dihexyl xanthate fluorene-dioctyl fluorene)-g-PVDF [PVDF graft copolymer (blue)] (2.30 g).

Figure 27:
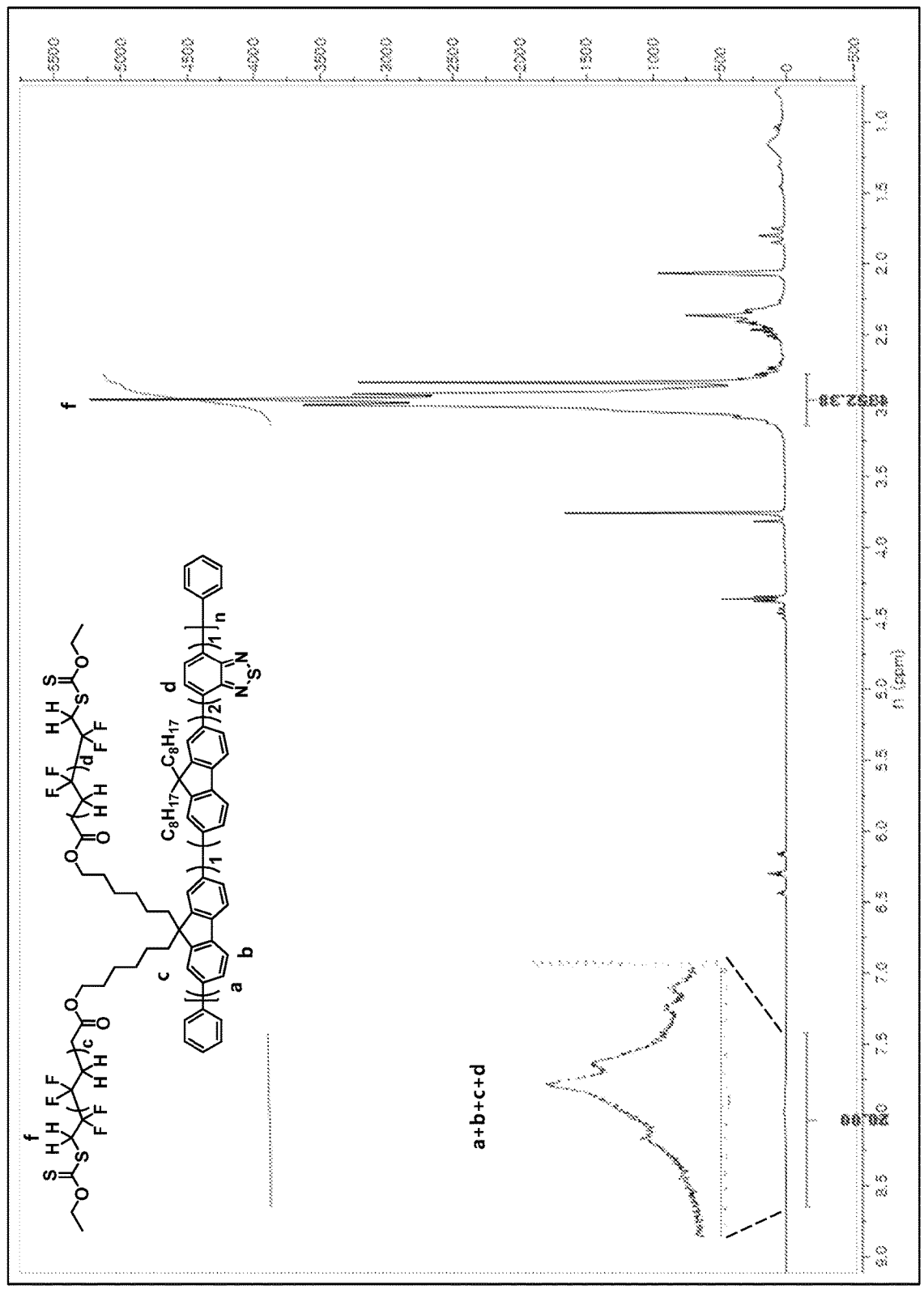
FIG. 27 is a diagram illustrating an NMR graph of a PVDF graft copolymer (green) synthesized according to Example 14.
Figure 28:
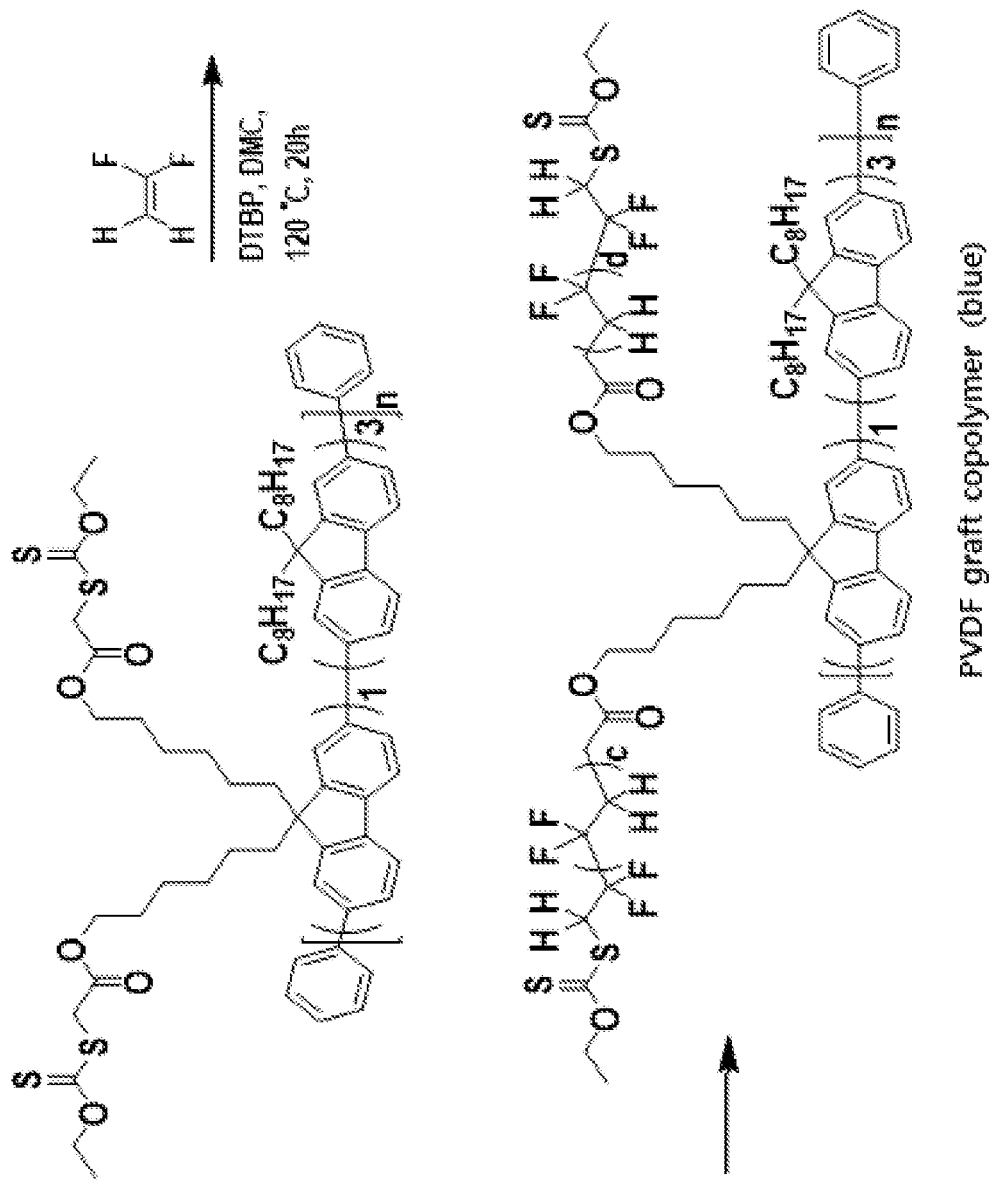
FIG. 28 is a diagram illustrating a synthesis reaction scheme of a polyfluorene-based polymer-PVDF graft copolymer [poly(dihexyl xanthate fluorene-dioctyl fluorene)-g-PVDF, PVDF graft copolymer (blue)] emitting blue light.
Figure 29:
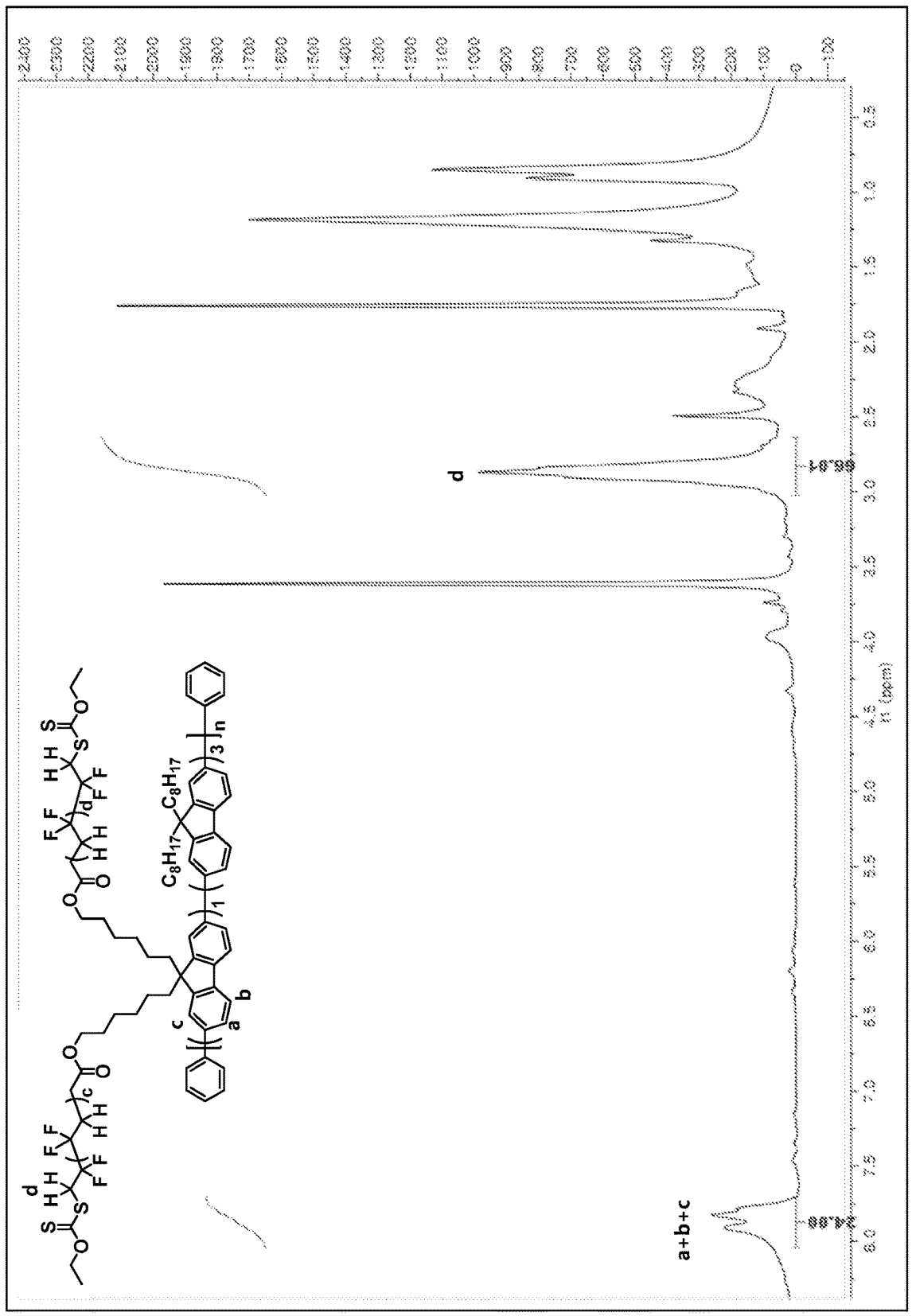
FIG. 29 is a diagram illustrating an NMR graph of a PVDF graft copolymer (blue) synthesized according to Example 15.

It was confirmed from FIGS. 27 and 29 that the PVDF graft copolymer purified in Examples 13 to 15 showed specific peaks of the PVDF and specific peaks of the polyfluorene-based polymers at 2.7 ppm by NMR analysis, and solubility characteristics were changed, and thus a graft copolymer containing a polyfluorene-based polymer as a main chain and a PVDF as a side chain was synthesized.

<Example 16>

Figure 30:
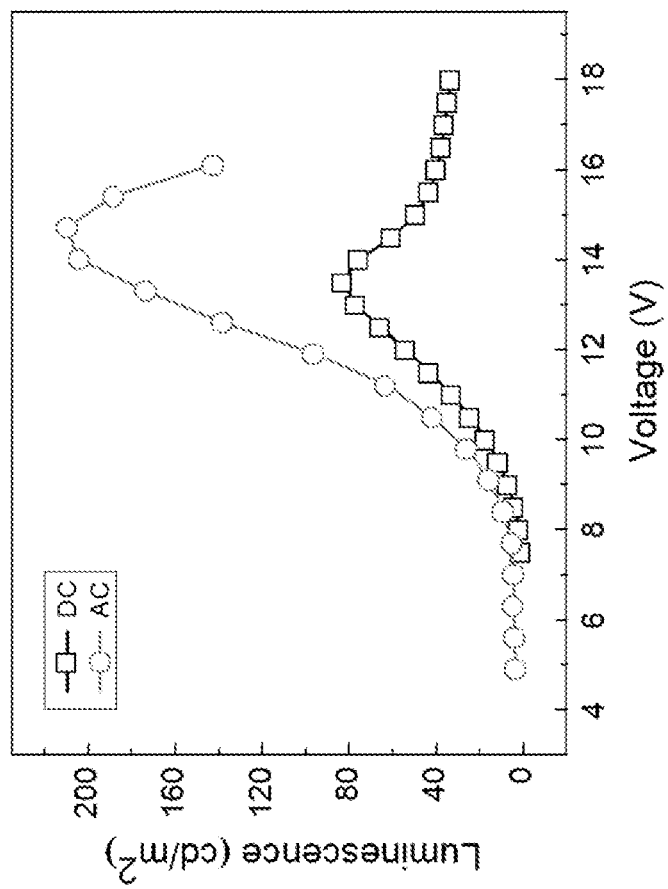
FIG. 30 illustrates electroluminescence performance data in direct current and alternating current of the PVDF graft copolymer (green) synthesized according to Example 14.
Figure 31:
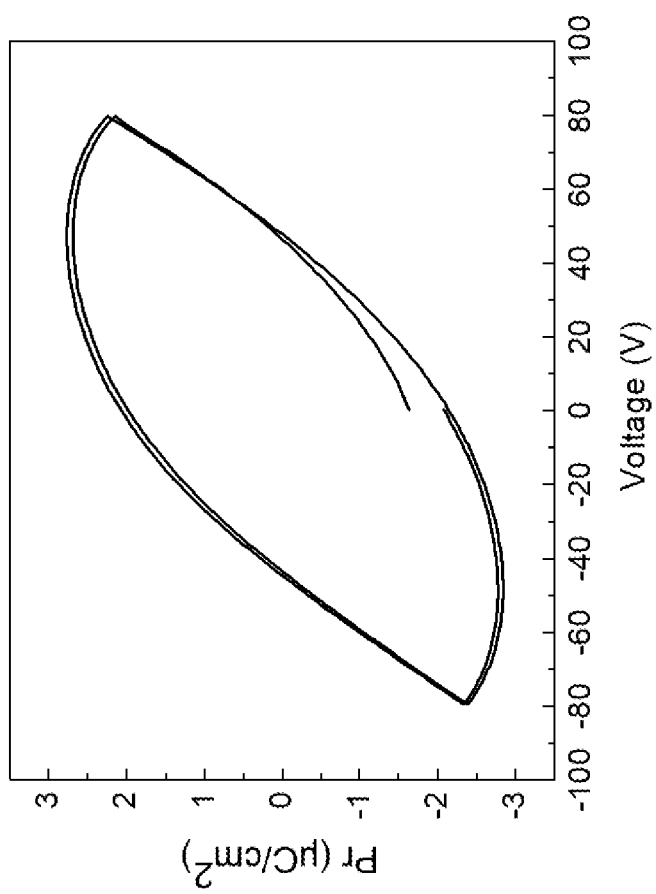
FIG. 31 is the data of hysteresis loop of the PVDF graft copolymer (green) prepared according to Example 14.

In order to check the luminescence performance and piezoelectric performance of the PVDF graft copolymer, the PVDF graft copolymer (green) synthesized in Example 14 was manufactured as an element, and electroluminescence and hysteresis loop were measured. As a result of measuring the luminescence performance, it was confirmed that the element has a lower driving voltage in alternating current (AC) than in direct current (DC), and has a luminescence performance of up to 209.94 cd/m$^2$ in AC, as shown in FIG. 30. Further, the hysteresis loop was measured to check whether the element has piezoelectric properties, and as a result, it was confirmed that a schematic graph in the form of a closed curve appeared, as shown in FIG. 31. Thus, it is expected that the element exhibited luminescence performance and piezoelectric performance independently of each other, so the PVDF graft copolymer will be available as a single material that exhibits both the piezoelectric properties and the luminescence properties.

Although the preferred embodiments of the present disclosure have been described for illustrative purposes, a person skilled in the art or a person having ordinary knowledge in the art will appreciate that various modifications and changes can be made to the present disclosure without departing from the spirit and scope of the present disclosure described in the claims to be described later.

Accordingly, the technical scope of the present disclosure should not be limited to the contents described in the detailed description of the specification, but should be determined by the claims.

The invention claimed is:

1. A polyfluorene-based polymer-polyvinylidene fluoride graft copolymer represented by the following Formula 1:

[Formula 1]

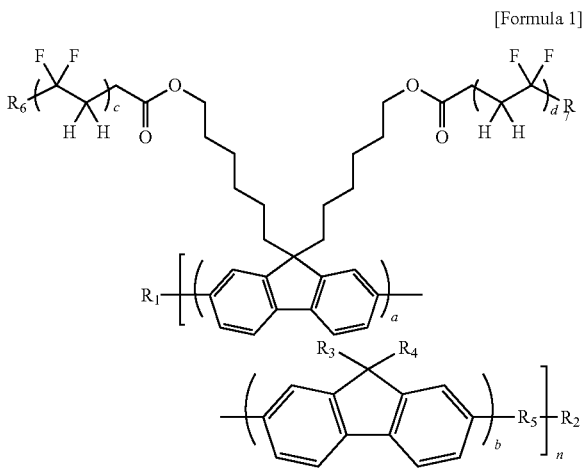

wherein $R_1$ and $R_2$ are each independently a hydrogen atom, a deuterium atom, a halogen atom, a cyano group, a substituted or unsubstituted aryl group having 6 to 30 ring carbon atoms, or a substituted or unsubstituted heteroaryl group having 2 to 30 ring carbon atoms, $R_3$ and $R_4$ are each independently a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, $R_5$ is a direct linkage, a substituted or unsubstituted arylene group having 6 to 30 ring carbon atoms, or a substituted or unsubstituted heteroarylene group having 2 to 30 ring carbon atoms, $R_6$ and $R_7$ are each independently a hydrogen atom, a deuterium atom, a halogen atom, a cyano group, a substituted or unsubstituted alkyl group having 1 to 10 carbon atoms, a substituted or unsubstituted alkyl xanthate group having 1 to 10 carbon atoms, or a substituted or unsubstituted aryl group having 6 to 30 ring carbon atoms, a, b, c, and d are each independently an integer of 1 to 3, and n is an integer of 1 to 5.

2. The polyfluorene-based polymer-polyvinylidene fluoride graft copolymer of claim 1, wherein $R_1$ and $R_2$ are each independently a substituted or unsubstituted aryl group having 6 to 30 ring carbon atoms.

3. The polyfluorene-based polymer-polyvinylidene fluoride graft copolymer of claim 2, wherein $R_1$ and $R_2$ are each independently a substituted or unsubstituted phenyl group.

4. The polyfluorene-based polymer-polyvinylidene fluoride graft copolymer of claim 1, wherein $R_3$ and $R_4$ are each independently a substituted or unsubstituted alkyl group having 1 to 10 carbon atoms.

5. The polyfluorene-based polymer-polyvinylidene fluoride graft copolymer of claim 1, wherein $R_5$ is a direct linkage or a heteroarylene group, wherein the heteroarylene group is unsubstituted or substituted by a halogen atom or an alkyl group having 1 to 10 carbon atoms, and has 2 to 30 ring carbon atoms and 1 to 4 heteroatoms, wherein the heteroatom is one or more selected from N and S.

6. The polyfluorene-based polymer-polyvinylidene fluoride graft copolymer of claim 5, wherein $R_5$ is a direct linkage, or a substituted or unsubstituted benzothiadiazolylene group or a substituted or an unsubstituted benzothiadiazolylene group in which a substituted or unsubstituted thiophenyl group is linked to both sides.

7. The polyfluorene-based polymer-polyvinylidene fluoride graft copolymer of claim 1, wherein $R_6$ and $R_7$ are each independently an alkyl xanthate group which has 1 to 10 carbon atoms and is unsubstituted or substituted by a halogen atom or an alkyl group having 1 to 10 carbon atoms.

8. The polyfluorene-based polymer-polyvinylidene fluoride graft copolymer of claim 7, wherein $R_6$ and $R_7$ are the same as each other, and are an alkyl xanthate group having 1 to 10 carbon atoms substituted by a halogen atom.

9. The polyfluorene-based polymer-polyvinylidene fluoride graft copolymer of claim 1, wherein Formula 1 is represented by any one of the following Formulas 1-1 to 1-3:

[Formula 1-1]

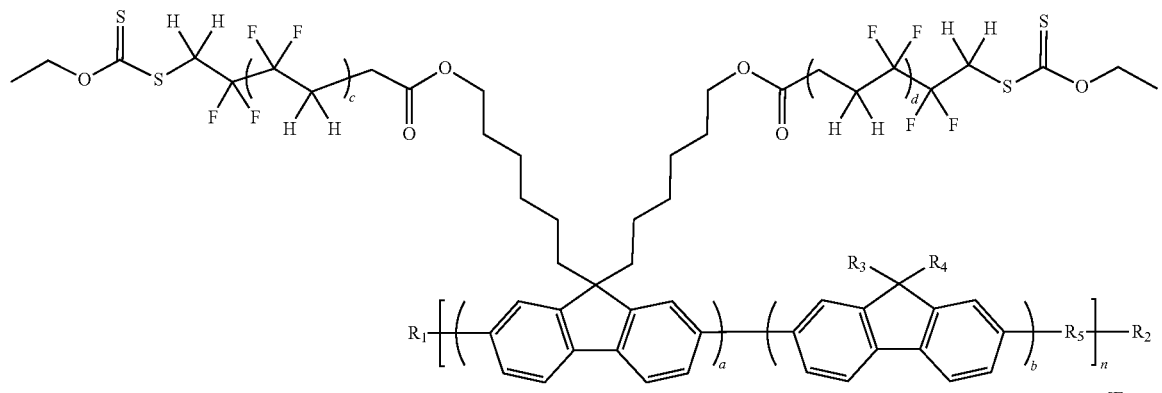

[Formula 1-2]

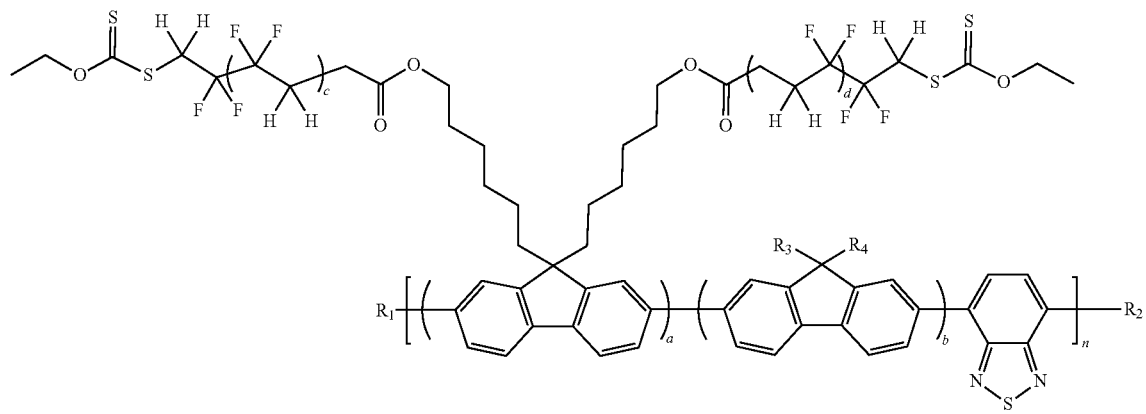

[Formula 1-3]
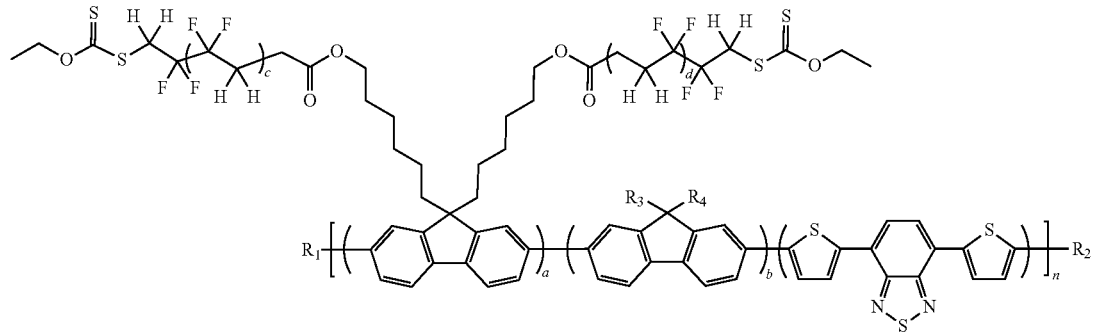
wherein
$R_1$ to $R_4$, a to d, and n are as defined in Formula 1.
10. The polyfluorene-based polymer-polyvinylidene fluoride graft copolymer of claim 1, wherein Formula 1 is represented by any one of the following Formulas 1-4 to 1-6:
[Formula 1-4]
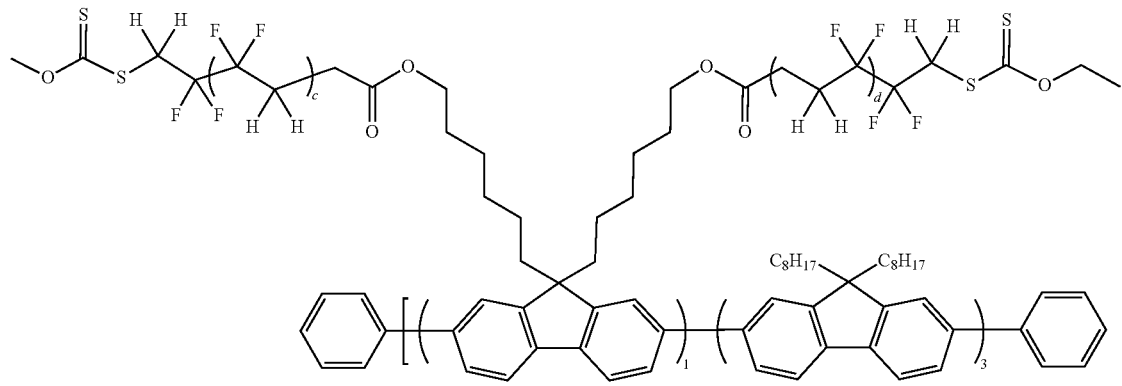
[Formula 1-5]
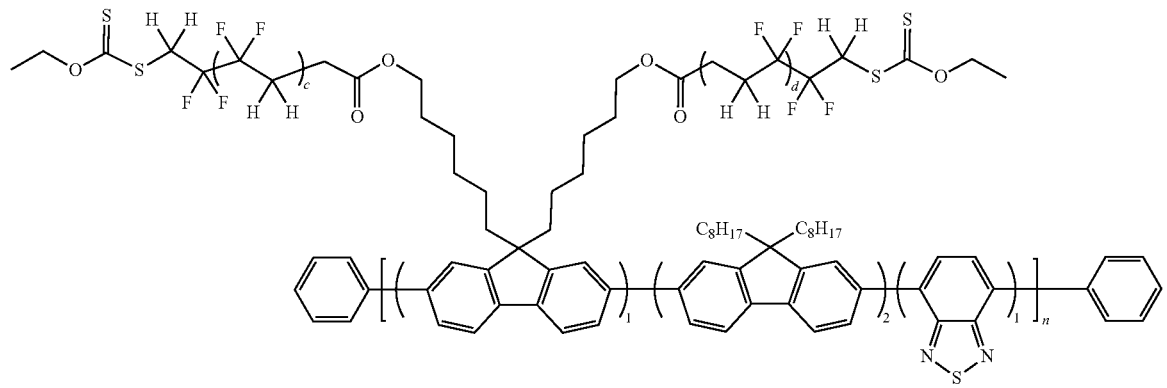

-continued

[Formula 1-6]

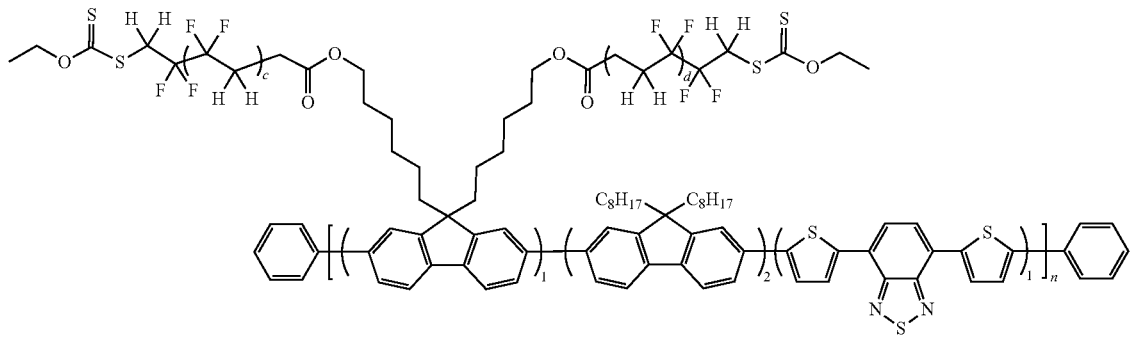

wherein
c, d, and n are as defined in claim 1.

11. An element, comprising:
a substrate;
a first electrode disposed on the substrate;
a light emitting layer disposed on the first electrode; and
a second electrode disposed on the light emitting layer,
wherein the light emitting layer includes a polyfluorene-based polymer-polyvinylidene fluoride graft copolymer represented by the following Formula 1:

[Formula 1]

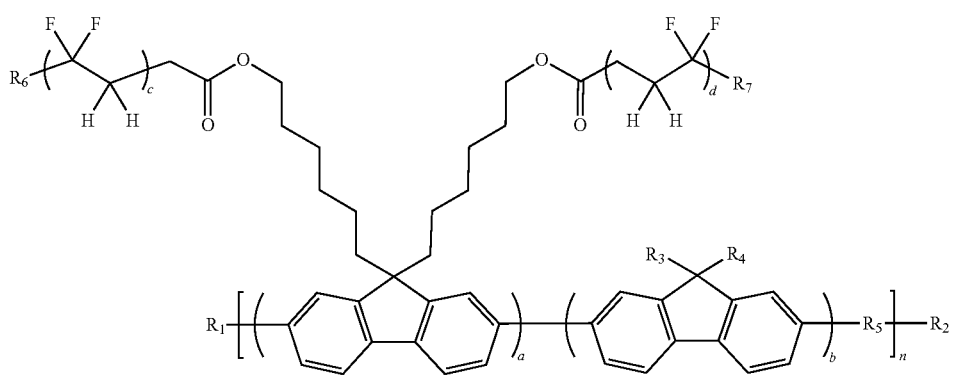

wherein
$R_1$ and $R_2$ are each independently a hydrogen atom, a deuterium atom, a halogen atom, a cyano group, a substituted or unsubstituted aryl group having 6 to 30 ring carbon atoms, or a substituted or unsubstituted heteroaryl group having 2 to 30 ring carbon atoms,
$R_3$ and $R_4$ are each independently a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms,
$R_5$ is a direct linkage, a substituted or unsubstituted arylene group having 6 to 30 ring carbon atoms, or a substituted or unsubstituted heteroarylene group having 2 to 30 ring carbon atoms,
$R_6$ and $R_7$ are each independently a hydrogen atom, a deuterium atom, a halogen atom, a cyano group, a substituted or unsubstituted alkyl group having 1 to 10 carbon atoms, a substituted or unsubstituted alkyl xanthate group, or a substituted or unsubstituted aryl group having 6 to 30 ring carbon atoms,
a, b, c, and d are each independently an integer of 1 to 3, and
n is an integer of 1 to 5.

12. The element of claim 11, wherein Formula 1 is represented by any one of the following Formulas 1-4 to 1-6:

[Formula 1-4]

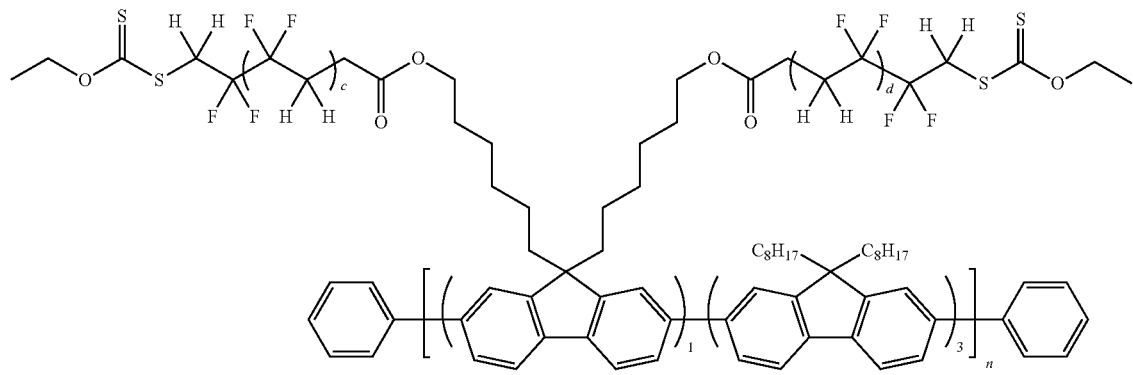

[Formula 1-5]

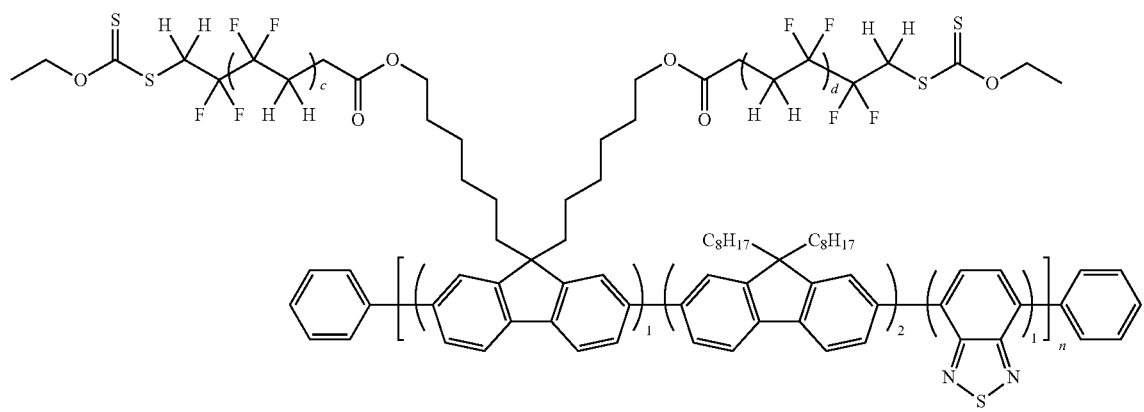

[Formula 1-6]

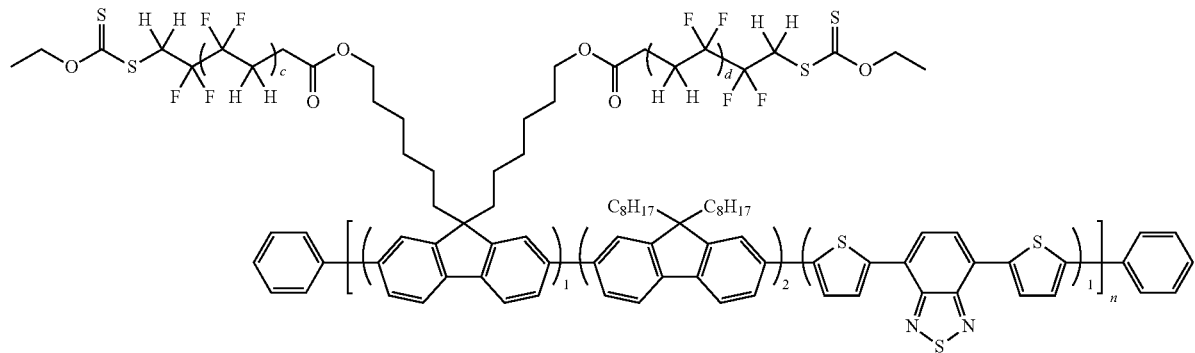

wherein c, d, and n are as defined in claim 8.

13. The element of claim 11, wherein
a copolymer represented by Formula 1-4 emits blue light,
a copolymer represented by Formula 1-5 emits green light, and
a copolymer represented by Formula 1-6 emits red light.

14. The element of claim 11, wherein the substrate is a flexible substrate.

15. The element of claim 11, wherein the element exhibits both piezoelectricity and luminescence.

16. The element of claim 11, wherein the element is used for a wearable electronic element, an electronic skin, or an electronic element for a vehicle.

* * * * *